US012672475B2

(12) United States Patent
Jeong et al.

(10) Patent No.: US 12,672,475 B2
(45) Date of Patent: Jun. 30, 2026

(54) DISPLAY DEVICE INCLUDING ORGANIC SENSOR LAYER WITH COLORANT

(71) Applicant: Samsung Display Co., Ltd., Yongin-si (KR)

(72) Inventors: Seungyeon Jeong, Yongin-si (KR); Su Jeong Kim, Yongin-si (KR); Taeho Kim, Yongin-si (KR); Hyeoji Kang, Yongin-si (KR); Ohjeong Kwon, Yongin-si (KR); Mihwa Lee, Yongin-si (KR); Hongyeon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 492 days.

(21) Appl. No.: 18/193,719

(22) Filed: Mar. 31, 2023

(65) Prior Publication Data

US 2023/0422585 A1     Dec. 28, 2023

(30) Foreign Application Priority Data

Jun. 27, 2022     (KR) ........................ 10-2022-0078459

(51) Int. Cl.
    *H10K 59/80*     (2023.01)
    *H10K 59/12*     (2023.01)
    *H10K 59/35*     (2023.01)
    *H10K 59/40*     (2023.01)
(52) U.S. Cl.
    CPC ......... *H10K 59/8792* (2023.02); *H10K 59/35* (2023.02); *H10K 59/40* (2023.02); *H10K 59/12* (2023.02)

(58) Field of Classification Search
    CPC .... H10K 59/8792; H10K 59/35; H10K 59/40; H10K 59/12; H10K 59/38; H10K 59/875; H10K 50/15; H10K 50/16; H10K 50/81; H10K 50/82; H10K 50/844; H10K 50/854; H10K 50/865; G06F 3/0412; G06F 2203/04103
    See application file for complete search history.

(56) References Cited

U.S. PATENT DOCUMENTS 10,714,710 B2     7/2020   Woo et al.
10,971,557 B2     4/2021   Jeong et al.
2018/0197921 A1 *   7/2018   Kim ...................... H10K 59/38

FOREIGN PATENT DOCUMENTS

KR     10-2018-0021342 A     3/2018
KR     10-2018-0082661 A     7/2018

* cited by examiner

*Primary Examiner* — John P. Dulka
(74) *Attorney, Agent, or Firm* — Womble Bond Dickinson (US) LLP

(57)     ABSTRACT
A display device includes a display panel, a sensor layer on the display panel, and a light control layer on the sensor layer and including a first colorant. The display panel includes a base substrate including a first light-emitting region emitting a first color light, and a second light-emitting region emitting a second color light having a light-emitting wavelength, a light-emitting element on the base substrate, and an encapsulation layer on the light-emitting element, and the sensor layer includes a sensor base layer on the encapsulation layer, a first conductive layer on the sensor base layer, an organic insulating film on the first conductive layer and including a second colorant, a second conductive layer on the organic insulating film, and an upper insulating layer on the second conductive layer. The organic insulating film overlaps the first light-emitting region.

20 Claims, 12 Drawing Sheets

- — · — · — Comparative Example 1
- — · · — First Embodiment 1
- ——— Second Embodiment 1

DISPLAY DEVICE INCLUDING ORGANIC SENSOR LAYER WITH COLORANT

CROSS-REFERENCE TO RELATED APPLICATION(S)

This application claims priority to and benefits of Korean Patent Application No. 10-2022-0078459 under 35 U.S.C. § 119, filed on Jun. 27, 2022, the entire contents of which are incorporated hereby by reference.

BACKGROUND

1. Technical Field

Embodiments relate to a display device having improved light efficiency and reduced reflection of external light.

2. Description of the Related Art

Various display devices, which are used in multimedia devices such as televisions, mobile phones, tablet computers, and game machines, are being developed. A display device may include various optical functional layers to provide a high quality color image to a user.

Recently, in order to implement various types of display devices such as a display device including a curved surface, a rollable display device, and a foldable display device, researches have been conducted on thin display devices in recent years. By including an optical functional layer having various functions, it is possible to reduce the number of optical functional layers and implement a display device having a thin thickness.

SUMMARY

Embodiments provide a display device capable of improving light efficiency and reducing or minimizing the reflection of external light.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display device including a display panel; a sensor layer disposed on the display panel; and a light control layer disposed on the sensor layer and including a first colorant, wherein the display panel may include: a base substrate in which a first light-emitting region that emits a first color light and a second light-emitting region that emits a second color light having a light-emitting wavelength different from a light-emitting wavelength of the first color light are defined; a light-emitting element disposed on the base substrate; and an encapsulation layer disposed on the light-emitting element, and the sensor layer may include: a sensor base layer disposed on the encapsulation layer; a first conductive layer disposed on the sensor base layer; an organic insulating film disposed on the first conductive layer and including a second colorant; a second conductive layer disposed on the organic insulating film; and an upper insulating layer disposed on the second conductive layer, wherein the organic insulating film may overlap the first light-emitting region.

In an embodiment, the first color light may be red light, and the second color light may be green light or blue light.

In an embodiment, the organic insulating film may transmit the first color light and absorb the second color light.

In an embodiment, the sensor layer may further include an additional insulating film disposed on the first conductive layer and overlapping the second light-emitting region.

In an embodiment, in a wavelength range of about 400 nm to about 520 nm, a light transmittance of the organic insulating film may be about 30% or less.

In an embodiment, the organic insulating film may further include a scatterer.

In an embodiment, the upper insulating layer may overlap the first light-emitting region and the second light-emitting region.

In an embodiment, the display device may further include a light blocking member disposed on the sensor layer and including a light blocking opening overlapping the first light-emitting region and the second light-emitting region.

In an embodiment, the organic insulating film may overlap at least a portion of the light blocking member.

In an embodiment, an opening overlapping the second light-emitting region may be formed in the organic insulating film.

In an embodiment, a portion of the light control layer may be disposed in the opening of the organic insulating film.

In an embodiment, the light-emitting element may include: a first electrode disposed on the base substrate and overlapping the first light-emitting region and the second light-emitting region; a hole transport region disposed on the first electrode; a first light-emitting layer disposed on the hole transport region and overlapping the first light-emitting region, and that emits the first color light; a second light-emitting layer disposed on the hole transport region and overlapping the second light-emitting region, and that emits the second color light; an electron transport region disposed on the first light-emitting layer and the second light-emitting layer; a second electrode disposed on the electron transport region; and a capping layer disposed on the second electrode.

In an embodiment, the display panel may further include an inorganic deposition layer disposed between the light-emitting element and the encapsulation layer.

In an embodiment, a third light-emitting region that emits a third color light having a light-emitting wavelength different from light-emitting wavelengths of the first color light and the second color light may be defined on the base substrate, and the organic insulating film may not overlap the second light-emitting region and the third light-emitting region.

In an embodiment, a display device may include a display panel; a sensor layer disposed on the display panel; and a light control layer disposed on the sensor layer and including a first colorant, wherein the display panel may include: a base substrate in which a first light-emitting region that emits a first color light, a second light-emitting region that emits a second color light different from the first color light, and a third light-emitting region that emits a third color light different from the first color light and the second color light are defined; a light-emitting element disposed on the base substrate; and an encapsulation layer disposed on the light-emitting element, and the sensor layer may include: a sensor base layer disposed on the encapsulation layer; a first conductive layer disposed on the sensor base layer; an organic insulating film overlapping the first light-emitting region and including a second colorant; an inorganic insulating film overlapping the second light-emitting region and the third light-emitting region; a second conductive layer disposed on the organic insulating film and the inorganic insulating film; and an upper insulating layer disposed on the second conductive layer.

In an embodiment, the organic insulating film and the inorganic insulating film may be disposed on a same layer.

In an embodiment, a display device may include: a base substrate in which a first light-emitting region that emits a first color light, a second light-emitting region that emits a second color light different from the first color light, and a light blocking region adjacent to the first light-emitting region and the second light-emitting region are defined; a light-emitting element disposed on the base substrate and including a first light-emitting element overlapping the first light-emitting region and a second light-emitting element overlapping the second light-emitting region; an encapsulation layer disposed on the light-emitting element; a sensor base layer disposed on the encapsulation layer; a first conductive layer disposed on the sensor base layer; an organic insulating film disposed on the first conductive layer and including an opening overlapping the second light-emitting region; a second conductive layer disposed on the organic insulating film; an upper insulating layer disposed on the second conductive layer; a light blocking member disposed on the upper insulating layer, having a light blocking opening overlapping the first light-emitting region and the second light-emitting region, and overlapping the light blocking region; and a light control layer filling the opening of the organic insulating film and the light blocking opening of the light blocking member, disposed on the light blocking member, and including a first colorant.

In an embodiment, the first color light may be red light, and the second color light may be green light or blue light.

In an embodiment, each of the organic insulating film and the light control layer may be in contact with an upper surface of the sensor base layer.

In an embodiment, the organic insulating film may overlap the first light-emitting region and the light blocking region and may not overlap the second light-emitting region.

BRIEF DESCRIPTION OF THE DRAWINGS

The accompanying drawings are included to provide a further understanding of the invention, and are incorporated in and constitute a part of this description. The drawings illustrate embodiments and, together with the description, serve to explain principles of the invention. In the drawings.

Figure 6A:
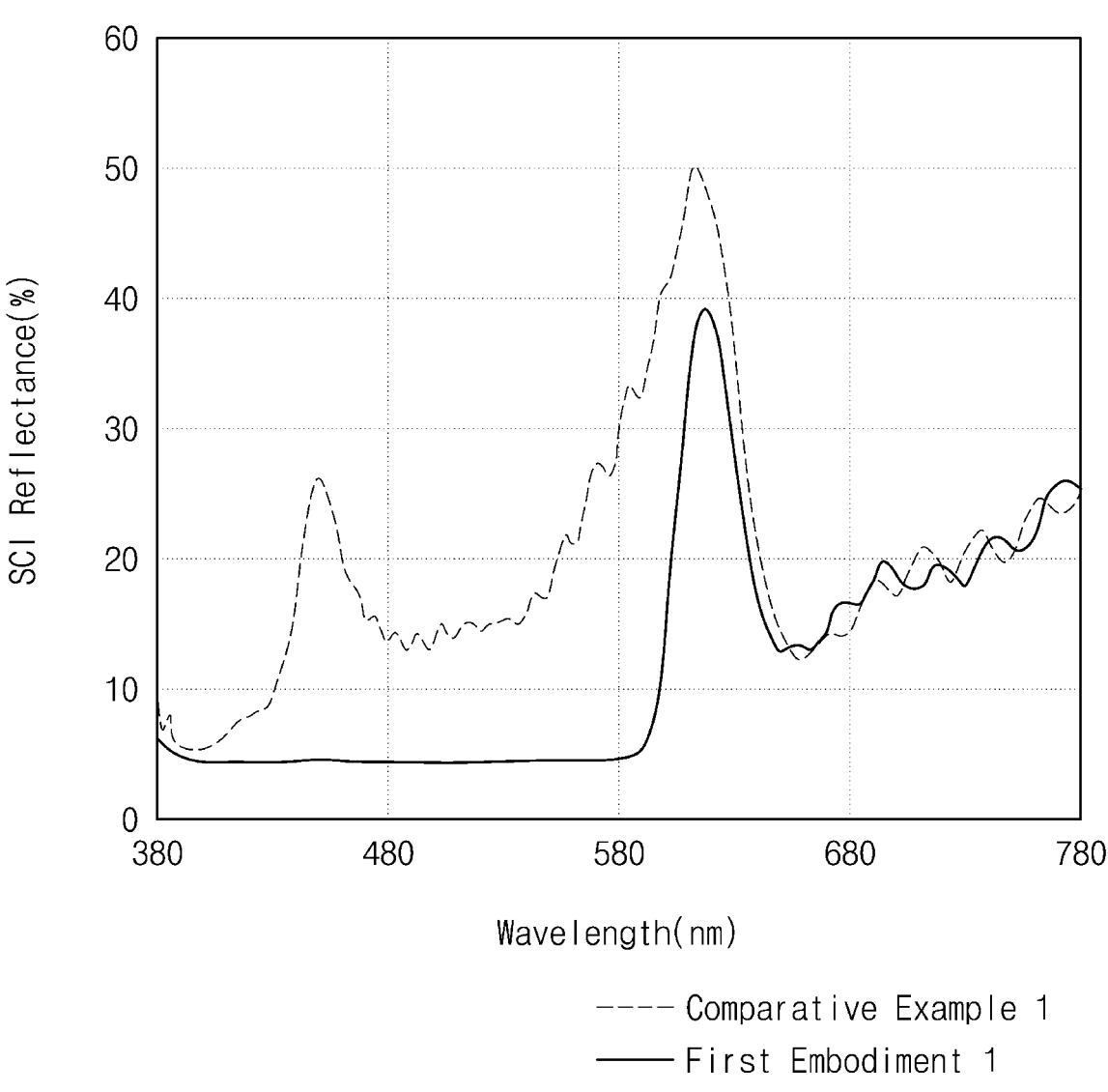
Figure 6B:
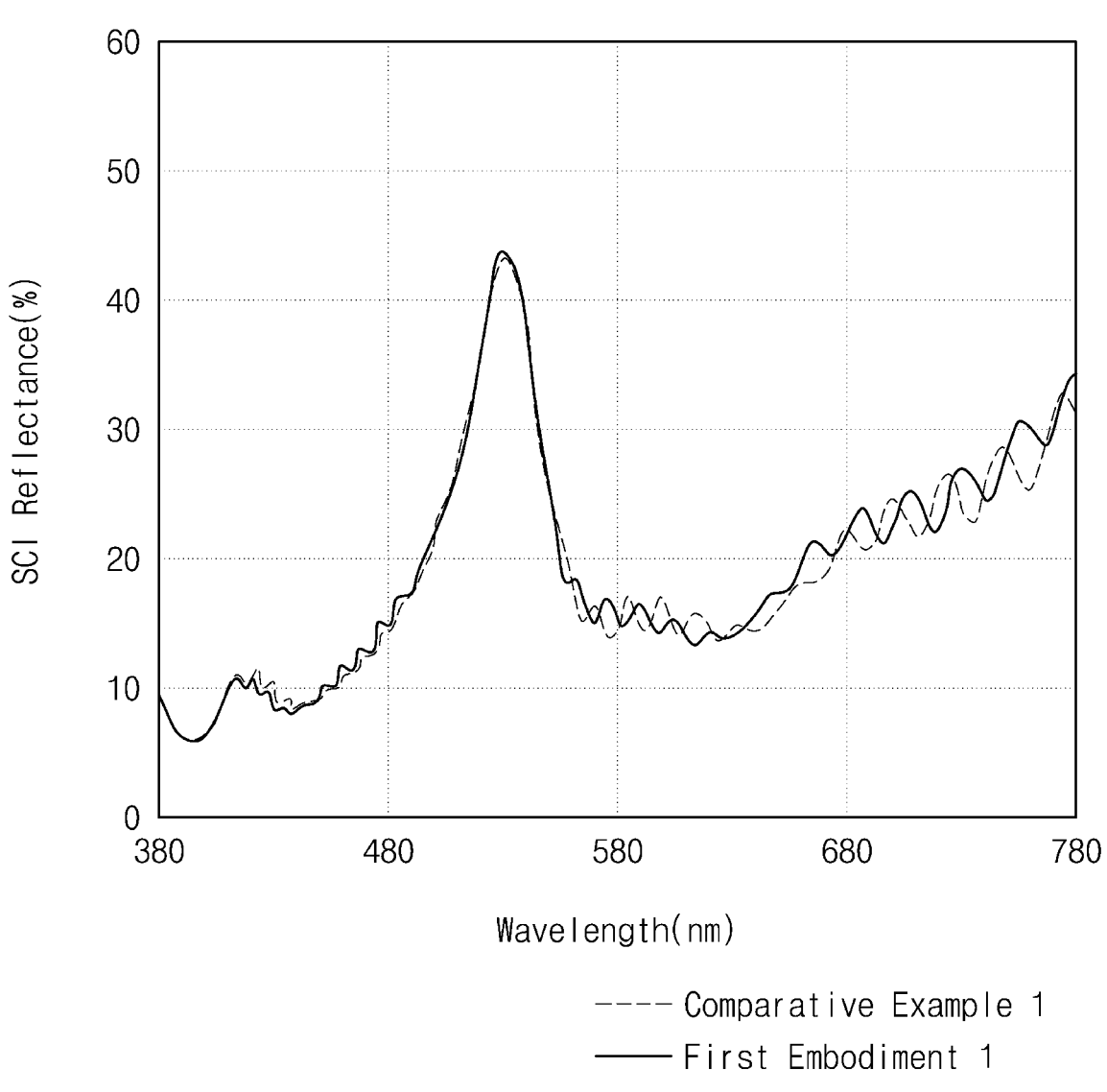
Figure 6C:
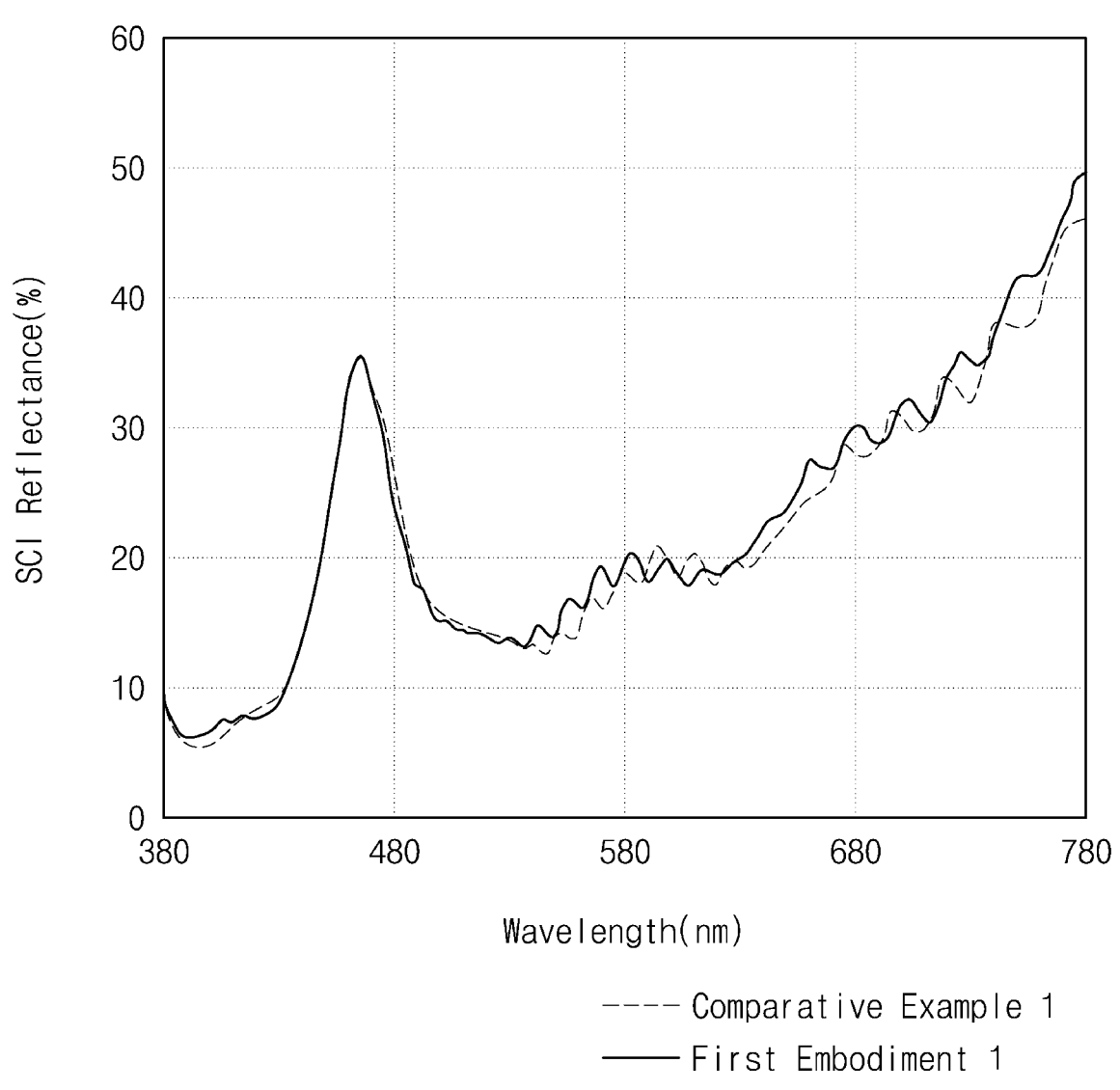
Figure 7A:
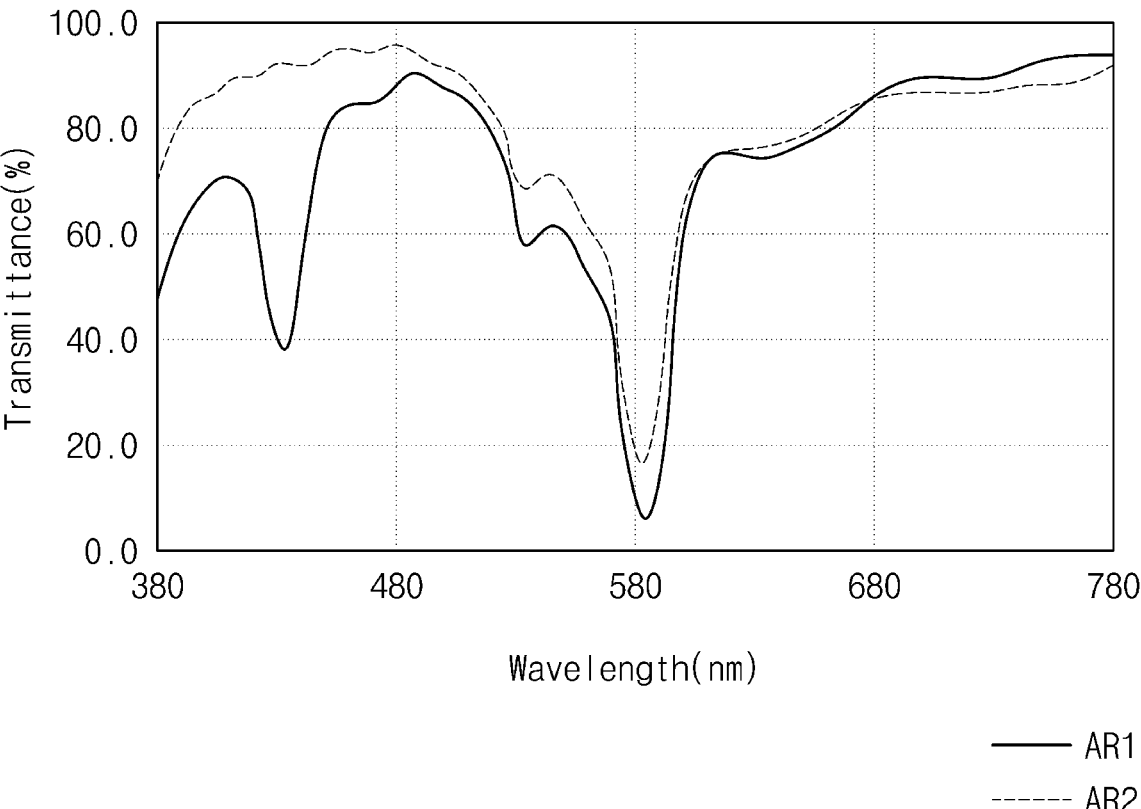
Figure 7B:
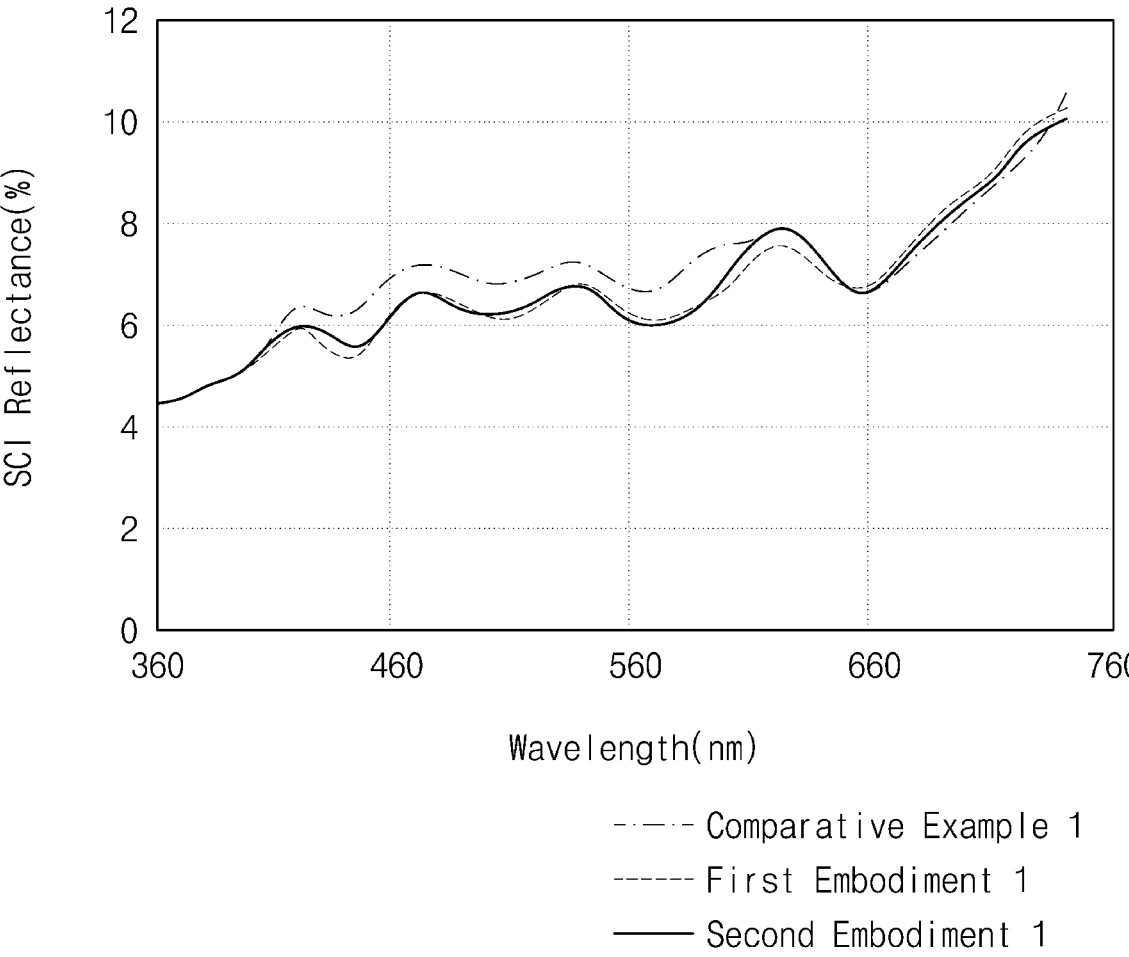
Figure 7C:
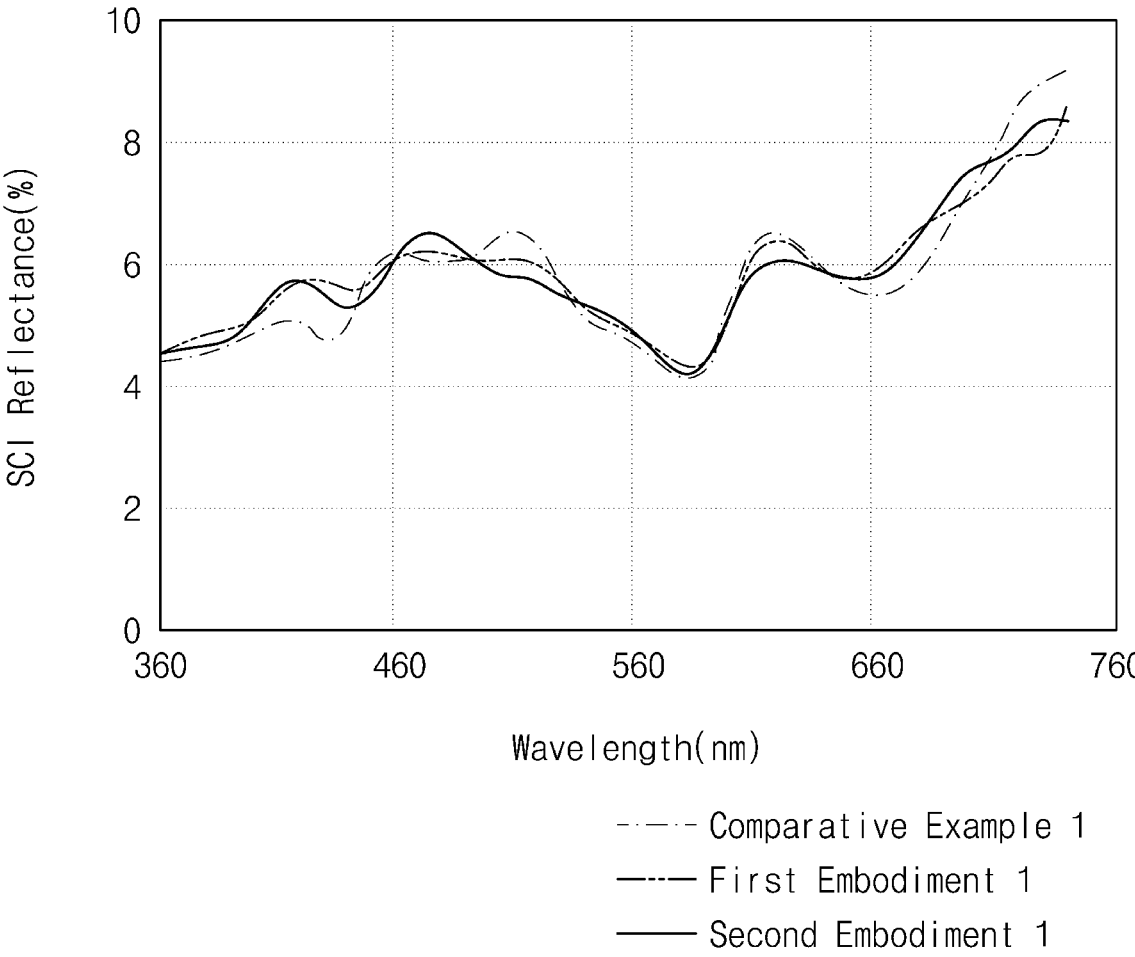
Figure 8:
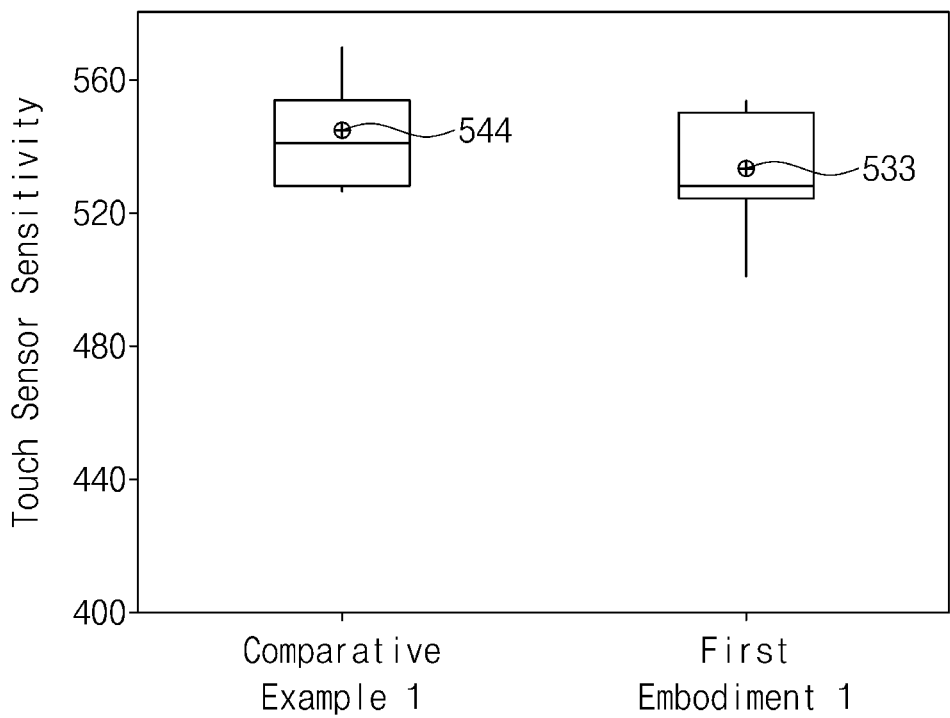

Each of FIGS. 6A, 6B, and 6C is a graph showing transmittance according to the wavelengths of the display devices of an embodiment and a comparative example;

FIG. 7A is a graph showing transmittance according to the wavelength of a light control layer according to an embodiment;

FIG. 7B is a graph showing the reflectance spectra of embodiments and a comparative example prior to application of the light control layer according to an embodiment;

FIG. 7C is a graph showing the reflectance spectra of the embodiments and the comparative example after application of the light control layer according to an embodiment; and FIG. 8 is a graph showing the result of evaluating the touch sensor sensitivity of the display devices of an embodiment and a comparative example.

DETAILED DESCRIPTION OF THE EMBODIMENTS

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, a display device according to an embodiment will be described with reference to the drawings.

Figure 1:
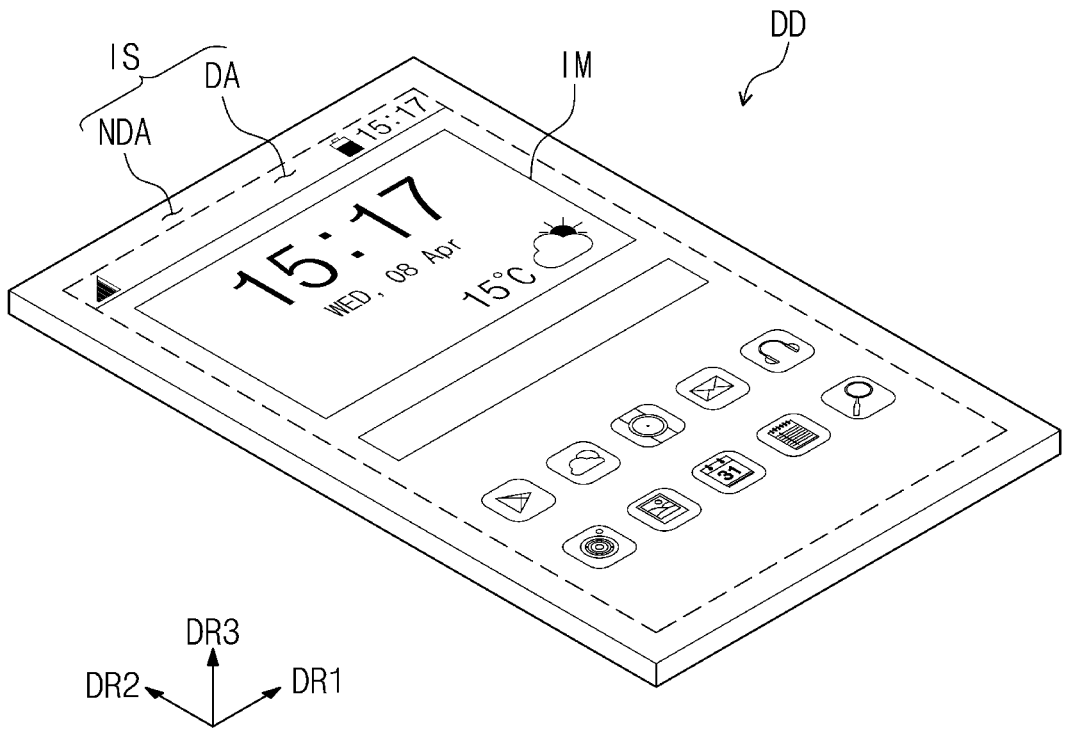
FIG. 1 is a schematic perspective view of a display device according to an embodiment.

FIG. 1 is a schematic perspective view of a display device according to an embodiment. FIG. 1 illustrates a portable electronic device as a display device DD. However, the display device DD may be used not only for large electronic devices such as televisions, monitors, or external billboards, but also for small and medium-sized electronic devices such as personal computers, notebook computers, personal digital terminals, car navigation units, game machines, smartphones, tablets, or cameras. These are presented as examples and may be employed in other electronic devices.

The display device DD may have a hexahedral shape having a thickness in a third direction DR3 on a plane defined by a first direction DR1 and a second direction DR2 crossing each other. However, this is illustrated as an example, and embodiments are not limited thereto. For example, the display device DD may have various shapes.

In an embodiment, an upper surface (or a front surface) and a lower surface (or a rear surface) of each member are defined based on the direction in which an image IM is displayed. The upper surface and the lower surface may be opposite to each other in the third direction DR3, and the normal direction of each of the upper surface and the lower surface may be parallel to the third direction DR3.

For example, the directions indicated by the first, second, and third directions DR1, DR2, and DR3 are relative concepts and may be converted into other directions.

The display device DD may display an image IM through a display surface IS. The display surface IS may include a display region DA in which the image IM is displayed and a non-display region NDA adjacent to the display region DA. The non-display region NDA may be a region in which an image is not displayed. The image IM may be a dynamic image, a moving image, or a static image. FIG. 1 illustrates application icons, a clock, and the like as an example of the image IM.

The display region DA may have a tetragonal shape. The non-display region NDA may surround the display region DA. However, this is an example, and embodiments are not limited thereto, and the shape of the display region DA and the shape of the non-display region NDA may be relatively designed. For example, the non-display region NDA may not exist on the front surface of the display device DD.

The display device DD may be a flexible device. This refers to a property of being bendable, and a flexible structure may include everything from a completely foldable structure to a structure that is bent to the scale of several nanometers. For example, the display device DD may be a curved display device or a foldable display device. However, embodiments are not limited thereto, the display device DD may be rigid.

Figure 2:
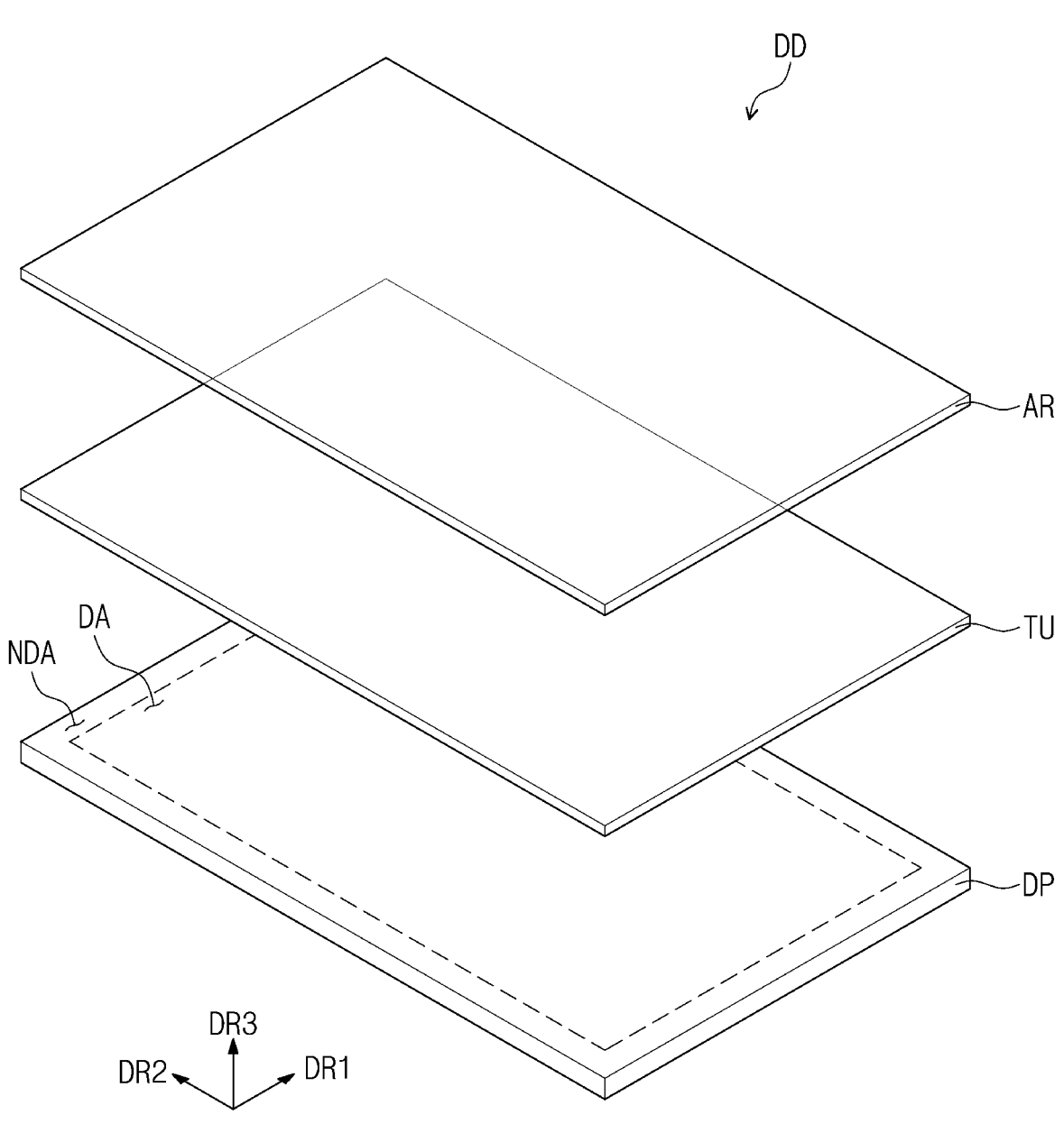
FIG. 2 is a schematic exploded perspective view of the display device according to an embodiment.

FIG. 2 is a schematic exploded perspective view of the display device according to an embodiment. Referring to FIG. 2, the display device DD according to an embodiment may include a display panel DP, a sensor layer TU, and a light control layer AR which are sequentially stacked in the third direction DR3.

The display panel DP may include pixels in a region corresponding to (or overlapping) the display device DD. The pixels may correspond to light-emitting regions PXA-R, PXA-G, and PXA-B (refer to FIG. 3). The pixels may emit (or display) light according to an electrical signal. Due to the pixels, the display region DA may display an image IM generated by light.

The display panel DP according to an embodiment may be a self-luminous display panel. For example, the display panel DP may be a micro LED display panel, a nano LED display panel, an organic light-emitting display panel, or a quantum dot light-emitting display panel. However, these are examples, and embodiments are not limited thereto as long as they are a self-luminous display panel.

The light-emitting layer of the organic light-emitting display panel may include an organic light-emitting material. The light-emitting layer of the quantum dot light-emitting display panel may include quantum dots and/or quantum rods. The micro LED display panel may include a micro light-emitting diode element that is a micro light-emitting element, and the nano LED display panel may include a nano light-emitting diode element. Hereinafter, the display panel DP will be described as an organic light-emitting display panel.

The light control layer AR may be disposed on the display panel DP. The light control layer AR may be a reflection prevention layer that reduces the reflectance of external light incident from the outside. The light control layer AR may selectively transmit light emitted from the display panel DP. The light control layer AR may not include a polarizing layer. Thus, light incident to the display panel DP and the sensor layer TU after passing through the light control layer AR may not be polarized. The display panel DP and the sensor layer TU may receive unpolarized light from above the light control layer AR.

The sensor layer TU may be disposed between the display panel DP and the light control layer AR. The sensor layer TU may acquire (or obtain) information for generating an image on the display panel DP by an external input. The external input may be a user's input. The user's input may include various types of external inputs, such as a part of the user's body, light, heat, a pen, or pressure.

Figure 3:
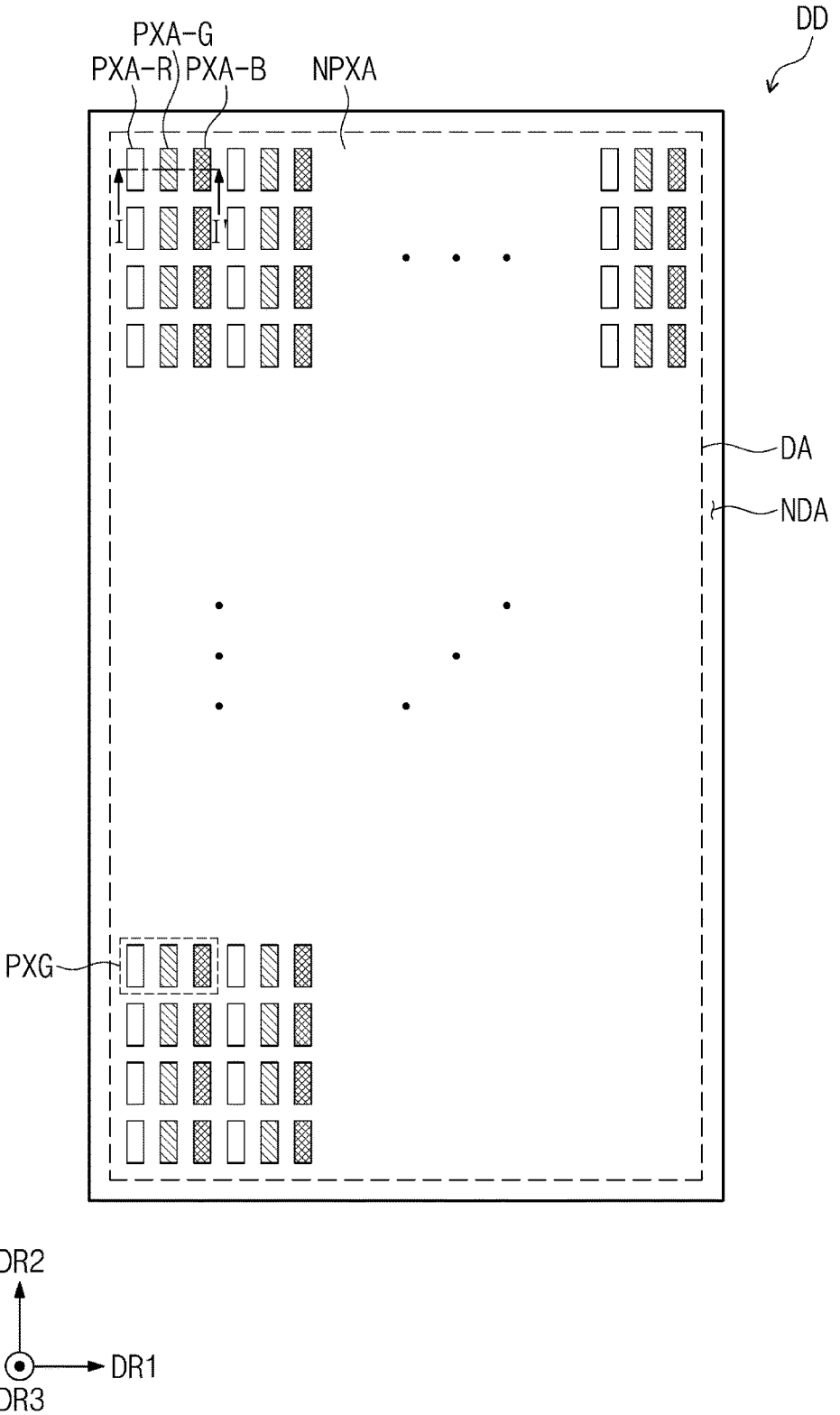
FIG. 3 is a schematic plan view of the display device according to an embodiment.
Figure 4:
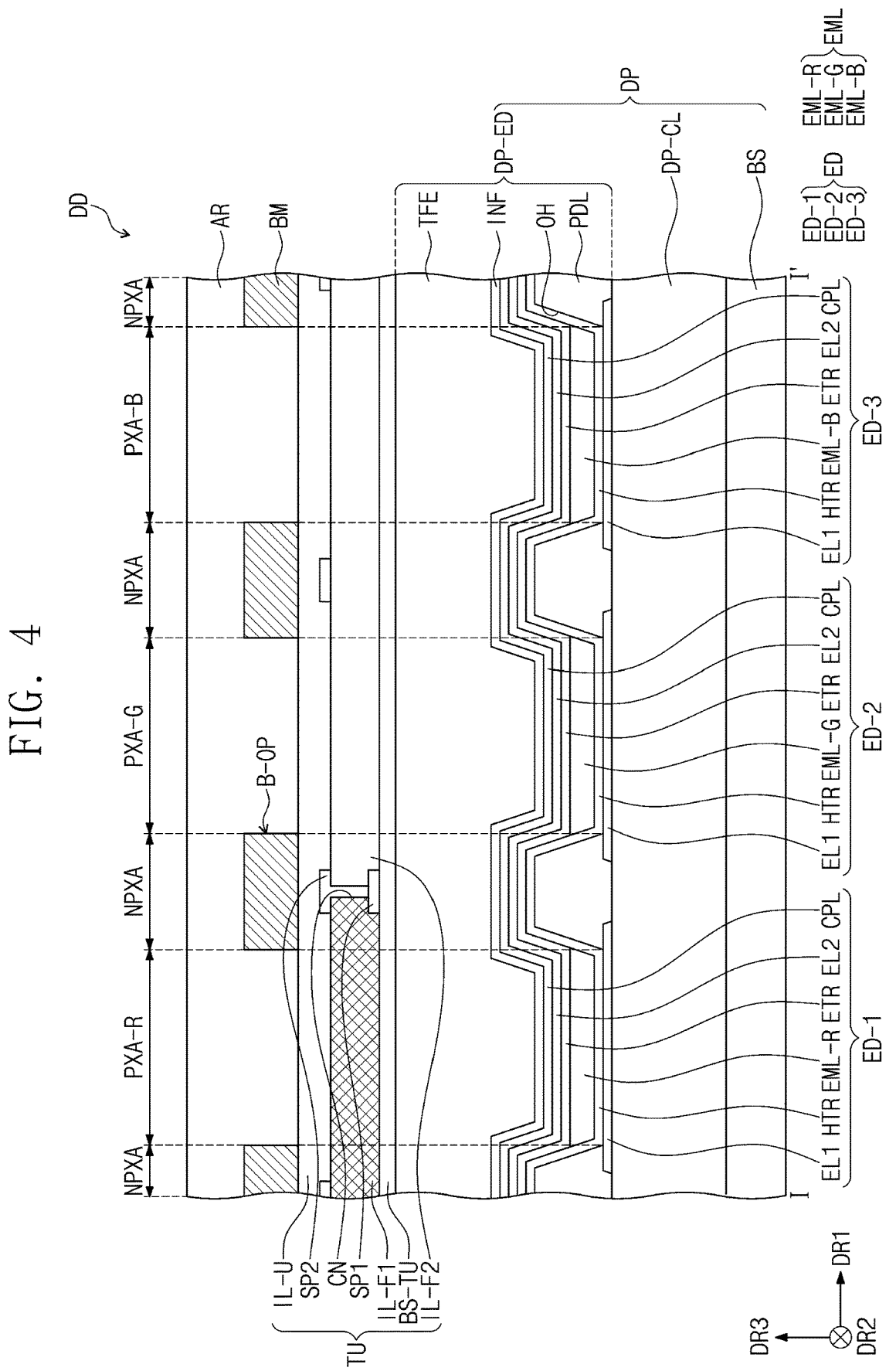
FIG. 4 is a schematic cross-sectional view of the display device according to an embodiment.

FIG. 3 is a schematic plan view of the display device according to an embodiment. FIG. 4 is a schematic cross-sectional view of the display device according to an embodiment. FIG. 4 is a schematic cross-sectional view of a portion corresponding to line I-I' of FIG. 3 in the display device according to an embodiment.

Referring to FIGS. 3 and 4, the display device DD according to an embodiment may include a display panel DP, a sensor layer TU disposed on the display panel DP, and a light control layer AR disposed on the sensor layer TU, which are sequentially stacked.

The display panel DP may include a base substrate BS, a circuit layer DP-CL, and a display element layer DP-ED, which are sequentially stacked. The display element layer DP-ED may include a pixel defining film PDL, light-emitting elements ED disposed in a pixel opening OH formed in the pixel defining film PDL, and an encapsulation layer TFE disposed on the light-emitting elements ED.

The base substrate BS may be rigid or flexible. The base substrate BS may be a polymer substrate, a plastic substrate, a glass substrate, a metal substrate, a composite material substrate, or the like. The base substrate BS may have a multi-layered structure as well as a single-layered structure. The base substrate BS may include a synthetic resin film, and the base substrate BS may have a multi-layered structure including synthetic resin film layers. The synthetic resin film may include a polyimide-based material, an acrylic-based material, a vinyl-based material, an epoxy-based material, a urethane-based material, a cellulose-based material, a perylene-based material and the like, but the synthetic resin film material is not limited to the above examples.

The circuit layer DP-CL may be disposed on the base substrate BS. The circuit layer DP-CL may include an insulating layer, a semiconductor pattern layer, a conductive pattern layer, a signal line, and the like. The circuit layer DP-CL may include transistors formed of a semiconductor pattern layer, a conductive pattern layer, a signal line, and the like. Each of the transistors may include a control electrode, an input electrode, and an output electrode. For example, the circuit layer DP-CL may include a switching transistor and a driving transistor which drive the light-emitting element ED.

The display element layer DP-ED may be disposed on the circuit layer DP-CL. The display element layer DP-ED may include a pixel defining film PDL, a light-emitting element ED, and an encapsulation layer TFE.

The light-emitting element ED may include light-emitting elements ED-1, ED-2, and ED-3. Each of the light-emitting elements ED-1, ED-2, and ED-3 may include a first electrode EL1, a hole transport region HTR, light-emitting layers EML-R, EML-G, and EML-B, an electron transport region ETR, a second electrode EL2, and a capping layer CPL. The first light-emitting element ED-1 may include a first light-emitting layer EML-R overlapping a first light-emitting region PXA-R. The second light-emitting element ED-2 may include a second light-emitting layer EML-G overlapping a second light-emitting region PXA-G. The third light-emitting element ED-3 may include a third light-emitting layer EML-B overlapping a third light-emitting region PXA-B.

The pixel defining film PDL may be disposed on the circuit layer DP-CL. Certain pixel openings OH may be formed in the pixel defining film PDL. The pixel openings OH formed in the pixel defining film PDL may respectively correspond to the light-emitting regions PXA-R, PXA-G, and PXA-B. The light blocking region NPXA may be a region between the neighboring light-emitting regions PXA-R, PXA-G, and PXA-B and correspond to the pixel defining film PDL.

The pixel defining film PDL may include an organic resin or an inorganic material. For example, the pixel defining film PDL may be formed of a polyacrylate-based resin, a polyimide-based resin, silicon nitride ($SiN_x$), silicon oxide ($SiO_x$), silicon oxynitride ($SiO_xN_y$), and the like.

Referring to FIG. 4, the light-emitting layers EML-R, EML-G, and EML-B of the light-emitting elements ED-1, ED-2, and ED-3 may be disposed in the pixel opening OH formed in the pixel defining film PDL. The hole transport region HTR, the electron transport region ETR, the second electrode EL2, and the capping layer CPL may be formed as a common layer in the entire light-emitting elements ED-1, ED-2, and ED-3. However, embodiments are not limited thereto. For example, the hole transport region HTR, the electron transport region ETR, the second electrode EL2, and the capping layer CPL may be formed by being patterned inside the pixel opening OH formed in the pixel defining film PDL. In an embodiment, at least any one of the hole transport region HTR, the light-emitting layers EML-R, EML-G, and EML-B, the electron transport region ETR, the second electrode EL2, or the capping layer CPL may be formed by being patterned by an inkjet printing method.

In the light-emitting element ED, the first electrode EL1 may be disposed on the circuit layer DP-CL. The first electrode EL1 may be an anode or a cathode. For example, the first electrode EL1 may be a pixel electrode. The first electrode EL1 may be a transmissive electrode, a semi-transmissive electrode, or a reflective electrode.

The hole transport region HTR may be disposed between the first electrode EL1 and the light-emitting layer EML. The hole transport region HTR may include at least one of a hole injection layer, a hole transport layer, or an electron blocking layer. The hole transport region HTR may be formed as a common layer so as to overlap all of the light-emitting regions PXA-R, PXA-G, and PXA-B and the pixel defining film PDL that separates the light-emitting regions PXA-R, PXA-G, and PXA-B from each other.

However, embodiments are not limited thereto, and the hole transport region HTR may be formed by being patterned so as to be separately disposed to overlap each of the light-emitting regions PXA-R, PXA-G, and PXA-B.

The light-emitting layer EML may be disposed on the first electrode EL1 The light-emitting layer EML may include light-emitting layers EML-R, EML-G, and EML-B. A first light-emitting layer EML-R may overlap the first light-emitting region PXA-R and may emit a first color light. A second light-emitting layer EML-G may overlap the second light-emitting region PXA-G and emit a second color light. A third light-emitting layer EML-B may overlap the third light-emitting region PXA-B and emit a third color light. In the light-emitting elements ED-1, ED-2, and ED-3 according to an embodiment, the first, second, and third color lights may be light of substantially different wavelength ranges. For example, the first color light may be red light in a wavelength range of about 625 nm to about 675 nm. For example, the second color light may be green light in a wavelength range of about 500 nm to about 570 nm. For example, the third color light may be blue light in a wavelength range of about 410 nm to about 480 nm.

The electron transport region ETR may be disposed between the light-emitting layer EML and the second electrode EL2. The electron transport region ETR may include at least one of an electron injection layer, an electron transport layer, or a hole blocking layer. The electron transport region ETR may be formed as a common layer so as to overlap all of the light-emitting regions PXA-R, PXA-G, and PXA-B and the pixel defining film PDL that separates the light-emitting regions PXA-R, PXA-G, and PXA-B from each other. However, embodiments are not limited thereto, and the electron transport region ETR may be formed by being patterned so as to be separately disposed to correspond to each of the light-emitting regions PXA-R, PXA-G, and PXA-B.

The second electrode EL2 may be formed on the electron transport region ETR. The second electrode EL2 may be a common electrode. The second electrode EL2 may be a cathode or an anode, but embodiments are not limited thereto. For example, in case that the first electrode EL1 is an anode, the second electrode EL2 may be a cathode, and in case that the first electrode EL1 is a cathode, the second electrode EL2 may be an anode. The second electrode EL2 may be a transmissive electrode, a semi-transmissive electrode, or a reflective electrode.

The capping layer CPL may be further disposed on the second electrode EL2. The capping layer CPL may include multiple layers or a single layer. In an embodiment, the capping layer CPL may be an organic layer or an inorganic layer. For example, in case that the capping layer CPL includes an inorganic material, the inorganic material may include an alkali metal compound such as LiF, an alkaline earth metal compound such as $MgF_2$, SiON, $SiN_x$, $SiO_y$, or the like. For example, in case that the capping layer CPL includes an organic material, the organic material may include α-NPD, NPB, TPD, m-MTDATA, $Alq_3$, CuPc, TPD15(N4,N4,N4',N4'-tetra (biphenyl-4-yl) biphenyl-4,4'-diamine), TCTA (4,4',4"-Tris (carbazol-9-yl) triphenylamine), etc., or an acrylate such as an epoxy resin or methacrylate. However, embodiments are not limited thereto.

For example, the refractive index of the capping layer CPL may be about 1.6 or more. For example, the refractive index of the capping layer CPL may be about 1.6 or more with respect to light in a wavelength range of about 550 nm to about 660 nm.

The encapsulation layer TFE may be disposed on the pixel defining film PDL to cover the light-emitting element ED. The encapsulation layer TFE may be disposed on the capping layer CPL and may be disposed to fill a portion of the pixel opening OH. As illustrated in FIG. 4, in case that the light-emitting element ED includes an inorganic deposition layer INF, the encapsulation layer TFE may be disposed on the inorganic deposition layer INF. The encapsulation layer TFE may function to protect the light-emitting element ED not only from moisture and/or oxygen, but also from foreign substances such as dust particles.

Although the encapsulation layer TFE is illustrated as a single layer in FIG. 4, the encapsulation layer TFE may include at least an organic film or an inorganic film, or may include an organic film and an inorganic film. For example, the encapsulation layer TFE may have a structure in which an organic film and an inorganic film are alternately and repeatedly stacked, or a structure in which an inorganic film, an organic film, and an inorganic film are sequentially stacked.

The inorganic film included in the encapsulation layer TFE may include, for example, a silicon nitride layer, a silicon oxynitride layer, a silicon oxide layer, a titanium oxide layer, an aluminum oxide layer, or the like. However, embodiments are not limited thereto. The organic film included in the encapsulation layer TFE may include an acryl-based organic layer, but embodiments are not limited thereto.

The display device DD may include a light blocking region NPXA and light-emitting regions PXA-R, PXA-G, and PXA-B. Each of the light-emitting regions PXA-R, PXA-G, and PXA-B may be a region from which light generated from each of the light-emitting elements ED-1, ED-2, and ED-3 is emitted. The light-emitting regions PXA-R, PXA-G, and PXA-B may be spaced apart from each other in a plan view.

Each of the light-emitting regions PXA-R, PXA-G, and PXA-B may be a region divided by the pixel defining film PDL. The light blocking region NPXA may be a region between the neighboring light-emitting regions PXA-R, PXA-G, and PXA-B and may overlap the pixel defining film PDL. In this description, each of the light-emitting regions PXA-R, PXA-G, and PXA-B may correspond to a pixel. The light-emitting elements ED-1, ED-2, and ED-3 may be divided by the pixel defining film PDL. The light-emitting layers EML-R, EML-G, and EML-B of the light-emitting elements ED-1, ED-2, and ED-3 may be divided by being disposed in the pixel opening OH formed in the pixel defining film PDL.

The light-emitting regions PXA-R, PXA-G, and PXA-B may be divided into groups according to the color of light generated from the light-emitting elements ED-1, ED-2, and ED-3. In the display device DD illustrated in FIGS. 1 and 2, three light-emitting regions PXA-R, PXA-G, and PXA-B that emit red light, green light, and blue light are illustrated. For example, the display device DD according to an embodiment may include a first light-emitting region PXA-R, a second light-emitting region PXA-G, and a third light-emitting region PXA-B that are separated from each other. In an embodiment, the first light-emitting region PXA-R may be referred to as a red light-emitting region PXA-R, the second light-emitting region PXA-G may be referred to as a green light-emitting region PXA-G, and the third light-emitting region PXA-B may be referred to as a blue light-emitting region PXA-B. In the display device DD according to an embodiment, a single red light-emitting region PXA-R, a single green light-emitting region PXA-G, and a single blue light-emitting region PXA-B may be collectively referred to as a unit pixel group PXG. For example, at least any one of the red light-emitting region PXA-R, the green light-emitting region PXA-G, or the blue light-emitting region PXA-B included in the unit pixel group PXG may be provided in plurality. For example, the unit pixel group PXG may include two green light-emitting regions PXA-G, one red light-emitting region PXA-R, and one blue light-emitting region PXA-B.

In the display device DD according to an embodiment, the light-emitting elements ED-1, ED-2, and ED-3 may emit light of different wavelength ranges or light of different colors. For example, in an embodiment, the display device DD may include a first light-emitting element ED-1 that emits red light, a second light-emitting element ED-2 that emits green light, and a third light-emitting element ED-3 that emits blue light. For example, the red light-emitting region PXA-R, the green light-emitting region PXA-G, and the blue light-emitting region PXA-B of the display device DD may respectively correspond to (or overlap) the first light-emitting element ED-1, the second light-emitting element ED-2, and the third light-emitting element ED-3.

However, embodiments are not limited thereto, and the first, second, and third light-emitting elements ED-1, ED-2, and ED-3 may emit light in the same wavelength region, or at least one thereof may emit light in a different wavelength region. For example, all of the first, second, and third light-emitting elements ED-1, ED-2, and ED-3 may emit blue light.

In the display device DD according to an embodiment, the light-emitting regions PXA-R, PXA-G, and PXA-B may be arranged in a stripe shape. Referring to FIG. 3, each of red light-emitting regions PXA-R, green light-emitting regions PXA-G, and blue light-emitting regions PXA-B may be aligned along the second direction DR2. For example, the red light-emitting region PXA-R, the green light-emitting region PXA-G, and the blue light-emitting region PXA-B may be alternately arranged in the order named along the first direction DR1.

FIGS. 3 and 4 illustrate that the areas of the light-emitting regions PXA-R, PXA-G, and PXA-B are similar to each other, but embodiments are not limited thereto, and the areas of the light-emitting regions PXA-R, PXA-G, and PXA-B may be different from each other according to the wavelength region of emitted light. For example, the areas of the light-emitting regions PXA-R, PXA-G, and PXA-B may refer to areas when viewed on a plane defined by the first direction DR1 and the second direction DR2.

For example, the arrangement shape of the light-emitting regions PXA-R, PXA-G, and PXA-B is not limited to what is illustrated in FIG. 3, and the order in which the red light-emitting region PXA-R, the green light-emitting region PXA-G, and the blue light-emitting region PXA-B are arranged may be provided in various combinations according to the characteristics of display quality required for the display device DD. For example, the light-emitting regions PXA-R, PXA-G, and PXA-B may have a Pentile™ arrangement shape or a Diamond Pixel™ arrangement shape.

For example, the areas of the light-emitting regions PXA-R, PXA-G, and PXA-B may be different from each other. For example, in an embodiment, the area of the green light-emitting region PXA-G may be smaller than the area of the blue light-emitting region PXA-B, but embodiments are not limited thereto.

Referring to FIG. 4, the display panel DP according to an embodiment may include an inorganic deposition layer INF disposed on the light-emitting elements ED-1, ED-2, and ED-3.

The inorganic deposition layer INF may be disposed on the capping layer CPL. The inorganic deposition layer INF may be disposed (e.g., directly disposed) on the capping layer CPL. The inorganic deposition layer INF may be a layer that prevents external light from being reflected by the second electrode EL2 of the light-emitting elements ED-1, ED-2, and ED-3. For example, since destructive interference occurs between light reflected from the surface of the inorganic deposition layer INF and light reflected from the second electrode EL2, the amount of external light reflected from the surface of the second electrode EL2 may be reduced. The thicknesses of the inorganic deposition layer INF and the capping layer CPL may be adjusted so that destructive interference may occur between light reflected from the surface of the inorganic deposition layer INF and light reflected from the second electrode EL2.

The inorganic deposition layer INF may include an inorganic material having a refractive index of about 1.0 or more and a light absorption coefficient of about 0.5 or more. The inorganic deposition layer INF may be formed by a thermal deposition process and include an inorganic material having a melting point of about 1000° C. or less. The inorganic deposition layer INF may include at least one selected from the group of, for example, bismuth (Bi) and ytterbium (Yb). The material of the inorganic deposition layer INF may be bismuth (Bi) or ytterbium (Yb), or may be an $Yb_xBi_y$-mixed deposition material. The encapsulation layer TFE may be disposed (e.g., directly disposed) on at least a portion of the inorganic deposition layer INF.

In an embodiment, the light control layer AR may be disposed on the display panel DP. The light control layer AR may overlap (e.g., entirely overlap) the display element layer DP-ED. The light control layer AR may overlap (e.g., entirely overlap) each of the first light-emitting element ED-1, the second light-emitting element ED-2, and the third light-emitting element ED-3. The light control layer AR may be formed as a continuous layer. The light control layer AR may cover the front surface of the display panel DP to protect the display panel DP. The light control layer AR may absorb a portion of light emitted from the display panel DP and may transmit a portion thereof, thereby improving color reproducibility. The color reproducibility refers to a range of colors that is expressed by a display device. For example, the color reproducibility may be improved by selectively absorbing light in a specific wavelength region.

The light control layer AR disposed on the display panel DP may not include a polarizing layer and may be a layer in which a dye and/or a pigment are dispersed in a base resin. As the light control layer AR does not include the polarizing layer, light incident to the display panel DP and the sensor layer TU after passing through the light control layer AR may not be polarized. The display panel DP and the sensor layer TU may receive unpolarized light from above the light control layer AR.

The light control layer AR may have a high light absorption rate in a specific wavelength range. The light control layer AR may include a first colorant having a high light absorption rate in a specific wavelength range. The first colorant may have a high light absorption rate in a specific wavelength range. The first colorant may have a high light absorption rate in at least one wavelength range. The first colorant may be a material that absorbs light having a maximum absorption wavelength in a wavelength range excluding the wavelength ranges of the first color light, the second color light, and the third color light. In an embodiment, the first colorant may be a material which absorbs light in a wavelength range of about 490 nm to about 505 nm and light in a wavelength range of about 585 nm to about 600 nm and transmits the remaining light. The first colorant may have a maximum absorption wavelength in a wavelength range of about 490 nm to about 505 nm and a wavelength range of about 585 nm to about 600 nm. As the first colorant included in the light control layer AR absorbs light in a specific wavelength region and transmits light in the remaining wavelength region, the first colorant may prevent reflection of external light and adjust the color of light emitted from the display panel DP.

The first colorant may include at least one of a dye or a pigment. For example, the first colorant included in the light control layer AR may include at least one selected from the group of an anthraquinone-based compound, a phthalocyanine-based compound, an azo-based compound, a perylene-based compound, a xanthene-based compound, a diimmonium-based compound, a dipyrromethene-based compound, a tetraazaporphyrin-based compound, a porphyrin-based compound, a squarylium-based compound, an oxazine-based compound, a triarylmethane-based compound, a cyanine-based compound, and a combination thereof. For example, the light control layer AR may include any one of a tetraazaporphyrin-based compound, a cyanine-based compound, a squarylium-based compound, and an oxazine-based compound, or a combination thereof.

The light control layer AR may include the first colorant in an amount of about 0.01 wt % to about 5.00 wt % with respect to the total weight of the light control layer AR. In case that the light control layer AR includes the first colorant in an amount of less than about 0.01 wt %, light in a specific wavelength region may not be sufficiently absorbed, and thus the color reproducibility may not be improved. In case that the light control layer AR includes the first colorant in an amount of more than about 5.00 wt %, aggregation of the first colorant may occur.

In an embodiment, the display device DD may further include a light blocking member BM disposed on the display element layer DP-ED. For example, the light blocking member BM may be covered by the light control layer AR, and may overlap the light blocking region NPXA. The light blocking member BM may include light blocking members BM, which are spaced apart from each other. The light blocking member BM may prevent light leakage. The light blocking member BM may be a member that blocks light. The light blocking member BM may include an organic light blocking material, a black pigment, a black dye, or the like.

The light control layer AR may fill a region between the light blocking members BM spaced apart from each other. A light blocking opening B-OP may be formed in the light blocking member BM. The light blocking opening B-OP may correspond to the first, second, and third light-emitting regions PXA-R, PXA-G, and PXA-B. A portion of the light control layer AR may be disposed in the light blocking opening B-OP. The light control layer AR may fill the light blocking opening B-OP and may be disposed on the light blocking member BM.

In an embodiment, the sensor layer TU may be disposed between the display panel DP and the light control layer AR. The sensor layer TU may include a sensor base layer BS-TU, a first conductive layer SP1, an organic insulating film IL-F1, an additional insulating film IL-F2, a second conductive layer SP2, and an upper insulating layer IL-U. The first conductive layer SP1 may be disposed on the sensor base layer BS-TU. The organic insulating film IL-F1 may cover at least a portion of the first conductive layer SP1 and may be disposed on the sensor base layer BS-TU and the first conductive layer SP1. The second conductive layer SP2 may be disposed on the organic insulating film IL-F1 and the additional insulating film IL-F2. The upper insulating layer IL-U may cover the second conductive layer SP2 and may be disposed on the organic insulating film IL-F1 and the additional insulating film IL-F2.

The sensor base layer BS-TU may be an inorganic layer including any one of silicon nitride, silicon oxynitride, and silicon oxide. In another example, the sensor base layer BS-TU may be an organic layer including an epoxy resin, an acrylic resin, or an imide-based resin. The sensor base layer BS-TU may have a single-layered structure or a multi-layered structure stacked along the third direction DR3. The sensor base layer BS-TU may be disposed (e.g., directly disposed) on the encapsulation layer TFE.

Each of the first conductive layer SP1 and the second conductive layer SP2 may have a single-layered structure or a multi-layered structure stacked along the third direction DR3. The single-layered conductive layers SP1 and SP2 may include a metal layer or a transparent conductive layer. The metal layer may include molybdenum, silver, titanium, copper, aluminum, or an alloy thereof. The transparent conductive layer may include transparent conductive oxide such as indium tin oxide (ITO indium zinc oxide (IZO), zinc oxide (ZnO), or indium zinc tin oxide (IZTO). For example, the transparent conductive layer may include conductive polymer such as PEDOT, metal nanowire, graphene, and the like.

The multi-layered conductive layers SP1 and SP2 may include metal layers. The metal layers may have, for example, a three-layer structure of titanium (Ti)/aluminum (Al)/titanium (Ti). The multi-layered conductive layers SP1 and SP2 may include at least one metal layer and at least one transparent conductive layer.

The organic insulating film IL-F1 may be disposed on the sensor base layer BS-TU. The organic insulating film IL-F1 may overlap the first light-emitting region PXA-R in a plan view. The organic insulating film IL-F1 may overlap (e.g., entirely overlap) the first light-emitting region PXA-R in a plan view. The organic insulating film IL-F1 may be disposed to correspond to (or overlap) the first light-emitting region PXA-R. The organic insulating film IL-F1 may not overlap the second light-emitting region PXA-G and the third light-emitting region PXA-B in a plan view. The organic insulating film IL-F1 may include a second colorant. At least a portion of the organic insulating film IL-F1 may include the second colorant. As the organic insulating film IL-F1 includes the second colorant, transmittance in a certain wavelength range may be controlled, and thus the color reproducibility of the display device DD may be improved.

The organic insulating film IL-F1 may transmit the first color light and may absorb the second color light and the third color light. The organic insulating film IL-F1 may function as a red filter. In an embodiment, the organic insulating film IL-F1 may have a light transmittance of about 30% or less in a wavelength range of about 400 nm to about 520 nm. The organic insulating film IL-F1 may have a low light transmittance of about 30% or less in a wavelength range of about 400 nm to about 520 nm, which deviates from the peak wavelength range of the first color light. Accordingly, the organic insulating film IL-F1 may block light having a wavelength different from that of the first color light, thereby improving the color reproducibility of the display panel DP. As the organic insulating film IL-F1 has a transmittance of about 30% or less in a wavelength range of about 400 nm to about 520 nm, the second color light and the third color light may be blocked. Accordingly, the organic insulating film IL-F1 may reduce light reflected by external light while selectively transmitting light of a specific wavelength range among the light provided from therebelow. Accordingly, the display device DD including the organic insulating film IL-F1 according to an embodiment may have a low reflectance and high color reproducibility.

The organic insulating film IL-F1 may have a light transmittance of about 80% or more in the wavelength range of the first color light emitted from the first light-emitting element ED-1. In an embodiment, the first color light may have a peak wavelength in a wavelength range of about 625 nm to about 675 nm, and the organic insulating film IL-F1 may have a light transmittance of about 80% or more in a wavelength range of about 625 nm to about 675 nm, which is the peak wavelength range of the first color light. However, embodiments are not limited thereto.

The organic insulating film IL-F1 may have a high light absorption rate in a specific wavelength range. The organic insulating film IL-F1 may include a second colorant having a high light absorption rate in a specific wavelength range. The second colorant included in the organic insulating film IL-F1 may absorb a specific wavelength and transmit light in the remaining wavelength region. The second colorant may have a high light absorption rate in a wavelength range of about 400 nm to about 580 nm. The second colorant may include two or more kinds of colorants in order to have a high light absorption rate in a wavelength range of about 400 nm to about 580 nm, but embodiments are not limited thereto. The second colorant may include a kind of colorant. In this description, the expression "exhibiting (or having) a high light absorption rate in a corresponding wavelength range" may mean having at least one absorption peak within a corresponding wavelength range in an absorption spectrum.

In an embodiment, the second colorant may include a red colorant. The second colorant may include at least one of a red pigment or a red dye. In an embodiment, the organic insulating film IL-F1 may include at least one red pigment of C.I. Pigment Red 1, 2, 3, 4, 5, 7, 9, 12, 14, 23, 38, 41, 42, 48, 48:1, 48:2, 48:3, 48:4, 48:5, 48:6, 49, 49:1, 51:1, 52:1, 52:2, 53, 53:1, 53:3, 57, 57:1, 57:2, 57:3, 58:2, 58:4, 63:1, 81, 81:1, 81:2, 81:3, 81:4, 81:5, 81:6, 88, 112, 122, 123, 144, 146, 148, 149, 150, 166, 168, 169, 170, 175, 176, 177, 178, 179, 184, 185, 187, 188, 190, 192, 194, 200, 200:1, 202, 206, 207, 208, 209, 210, 214, 216, 220, 221, 224, 242, 246, 247, 251, 253, 254, 255, 256, 257, 260, 262, 264, 270, 272, or 291. For example, the organic insulating film IL-F1 may include C.I. Pigment Red 291 or C.I. Pigment Red 177. For example, the organic insulating film IL-F1 may further include a perylene-based, perinone-based, quinacridone-based, quinacridonequinone-based, anthraquinone-based, anthanthrone-based, benzimidazolone-based, disazo-based, azo-based, indanthrone-based, phthalocyanine-based, triarylcarbonium-based, dioxazine-based, aminoanthraquinone-based, thioindigo-based, isoindoline-based, isoindolinone-based, pyranthrone-based, or iso-violanthrone-based red pigment, or a mixture thereof.

In an embodiment, the second colorant may include a yellow colorant. The second colorant may include at least one of a yellow pigment or a yellow dye. In an embodiment, the organic insulating film IL-F1 may include at least one yellow pigment of C.I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, or 214. For example, the organic insulating film IL-F1 may include C.I. Pigment Yellow 138, C.I. Pigment Yellow 139, or C.I. Pigment Yellow 231.

In an embodiment, the second colorant may include at least one of a red colorant or a yellow colorant. The second colorant may include any one of a red colorant and a yellow colorant, or both the red colorant and the yellow colorant, according to the color of light emitted from the first light-emitting region PXA-R.

The organic insulating film IL-F1 may include a base resin for dispersing the second colorant. The base resin may be a medium, in which the second colorant may be dispersed, and may be composed of various resin compositions that are generally referred to as binders. For example, the base resin may be an acrylic-based resin, a urethane-based resin, a silicone-based resin, an epoxy-based resin, or the like. The base resin may be a transparent resin. In this description, the expression "α-based" resin means a resin including a functional group of "α".

The organic insulating film IL-F1 may further include a scatterer. The organic insulating film IL-F1 may include a second colorant and a scatterer. For example, the second colorant and the scatterer, which are included in the organic insulating film IL-F1, may be formed by being dispersed in the base resin. The scatterer may be an inorganic particle. For example, the scatterer may include at least one of $TiO_2$, ZnO, $Al_2O_3$, $SiO_2$, or hollow silica. The scatterer may include any one of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

Referring to FIG. 4, the organic insulating film IL-F1 may overlap at least a portion of the light blocking member BM in a plan view. The organic insulating film IL-F1 may overlap at least a portion of the light blocking member BM adjacent to the first light-emitting region PXA-R. For example, the organic insulating film IL-F1 may overlap the entire first light-emitting region PXA-R in a plan view and overlap at least a portion of the light blocking region NPXA adjacent to the first light-emitting region PXA-R. However, embodiments are not limited thereto, the organic insulating film IL-F1 may not overlap the light blocking member BM in a plan view. For example, in a plan view, the organic insulating film IL-F1 may overlap only the first light-emitting region PXA-R and may not overlap the light blocking region NPXA, the second light-emitting region PXA-G, and the third light-emitting region PXA-B.

The organic insulating film IL-F1 may have a certain permittivity. The permittivity of the organic insulating film IL-F1 may be about 3.6 to about 5.0. For example, the permittivity of the organic insulating film IL-F1 may be about 3.8 to about 4.8. As the permittivity of the organic insulating film IL-F1 has the above-described range, parasitic capacitance between the first conductive layer SP1 and the second conductive layer SP2 may be minimized, and thus the deterioration of touch performance of the display device DD may be prevented. As it is not necessary to significantly increase the thickness of the organic insulating film IL-F1 in order to minimize the parasitic capacitance, the thickness of the display device DD may be minimized, thereby reducing manufacturing costs and realize a thin display device DD.

In an embodiment, the transmittance of the organic insulating film IL-F1 may be limited to a certain range by the thickness thereof, the type and content of the second colorant, and the like. It may be possible to control the transmittance of a certain wavelength range by the thickness of the organic insulating film IL-F1, the type and content of the second colorant, and the like. In an embodiment, the second colorant may be included in an amount of about 0.98% to about 4.48% by weight with respect to the total weight of the organic insulating film IL-F1. However, embodiments are not limited thereto. The content rate of the second colorant included in the organic insulating film IL-F1 may vary according to the thickness of the organic insulating film IL-F1.

In the display device DD according to an embodiment, by applying the organic insulating film IL-F1 including the second colorant, which is a short-wavelength absorbing colorant, to the sensor layer TU, the color reproducibility of the display device DD may be improved, and the reflection of external light may be prevented or minimized. Further, as the organic insulating film IL-F1 according to an embodiment is disposed to overlap the red light-emitting region PXA-R, light leakage may be prevented through absorption of light in a short wavelength region, and light emitted from the red light-emitting region PXA-R may be emitted at a high transmittance. Accordingly, the color reproducibility may be improved or increased.

The additional insulating film IL-F2 may be disposed on the sensor base layer BS-TU. The additional insulating film IL-F2 may be disposed on the sensor base layer BS-TU so as to cover at least a portion of the first conductive layer SP1. The additional insulating film IL-F2 may overlap the second light-emitting region PXA-G and the third light-emitting region PXA-B. The additional insulating film IL-F2 may overlap the second light-emitting region PXA-G and the third light-emitting region PXA-B and may not overlap the first light-emitting region PXA-R. In an embodiment, the organic insulating film IL-F1 and the additional insulating film IL-F2 may be disposed on the same layer (e.g., the sensor base layer BS-TU or the first conductive layer SP1). Each of the organic insulating film IL-F1 and the additional insulating film IL-F2 may be disposed on the sensor base layer BS-TU. Each of the organic insulating film IL-F1 and the additional insulating film IL-F2 may be in contact with the upper surface of the sensor base layer BS-TU.

The additional insulating film IL-F2 may overlap at least a portion of the light blocking member BM in a plan view. The additional insulating film IL-F2 may overlap at least a portion of the light blocking member BM adjacent to the second light-emitting region PXA-G and the third light-emitting region PXA-B. The additional insulating film IL-F2 may overlap at least a portion of the light blocking region NPXA adjacent to the second light-emitting region PXA-G and the third light-emitting region PXA-B in a plan view. The additional insulating film IL-F2 may overlap (e.g., entirely overlap) the light blocking region NPXA defined (or disposed) between the second light-emitting region PXA-G and the third light-emitting region PXA-B. However, embodiments are not limited thereto, the additional insulating film IL-F2 may not overlap the light blocking member BM in a plan view. For example, the organic insulating film IL-F1 may overlap (e.g., entirely overlap) the first light-emitting region PXA-R and the light blocking member BM, and the additional insulating film IL-F2 may overlap only the second light-emitting region PXA-G and the third light-emitting region PXA-B. In another example, the additional insulating film IL-F2 may be omitted. In the display device DD according to an embodiment, an opening overlapping the second light-emitting region PXA-G and the third light-emitting region PXA-B may be formed in the organic insulating film IL-F1, and at least a portion of the upper insulating layer IL-U or at least a portion of the light control layer AR may be disposed in the opening formed in the organic insulating film IL-F1.

The organic insulating film IL-F1 and the additional insulating film IL-F2 may not overlap each other in a plan view. As the organic insulating film IL-F1 overlaps the first light-emitting region PXA-R and the additional insulating film IL-F2 overlaps the second light-emitting region PXA-G and the third light-emitting region PXA-B, the organic insulating film IL-F1 and the additional insulating film IL-F2 may not overlap each other in a plan view.

The additional insulating film IL-F2 may include an inorganic material or an organic material. In case that the additional insulating film IL-F2 includes an inorganic material, the additional insulating film IL-F2 may include at least one of aluminum oxide, titanium oxide, silicon oxide, silicon oxynitride, zirconium oxide, or hafnium oxide. In this description, in case that the additional insulating film IL-F2 includes an inorganic material, the additional insulating film IL-F2 may be referred to as an inorganic insulating film.

In case that the additional insulating film IL-F2 includes an organic material, the additional insulating film IL-F2 may include an organic insulating material. The organic insulating material may include at least any one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin. However, this is an example, and the organic insulating material is not limited to the above examples.

The additional insulating film IL-F2 may have a certain permittivity. The permittivity and thickness of the additional insulating film IL-F2 may be provided in various combinations according to the characteristics of touch sensitivity required for the display device DD. In an embodiment, the permittivity of the additional insulating film IL-F2 may be about 3.6 to about 5.7. As the permittivity of the additional insulating film IL-F2 is in the above-mentioned range, the parasitic capacitance between the first conductive layer SP1 and the second conductive layer SP2 may be minimized, and thus the deterioration of touch performance of the display device DD may be prevented. As it is not necessary to significantly increase the thickness of the additional insulating film IL-F2 in order to minimize the parasitic capacitance, the thickness of the display device DD may be minimized, thereby reducing manufacturing costs and realize a thin display device DD.

The organic insulating film IL-F1 and the additional insulating film IL-F2 may be formed to have a constant thickness in the third direction DR3. With respect to the third direction DR3, the organic insulating film IL-F1 and the additional insulating film IL-F2 may have substantially the same thickness as each other. However, embodiments are not limited thereto, the thicknesses of the organic insulating film IL-F1 and the additional insulating film IL-F2 may be different from each other. In this description, the expression "being substantially the same" means not only being physically the same in the numerical range of width or the like, but also being the same in the numerical range of width or the like including process errors that generally occur.

A contact hole CN may be formed between the organic insulating film IL-F1 and the additional insulating film IL-F2. The first conductive layer SP1 and the second conductive layer SP2 may be electrically connected to each other through the contact hole CN. The contact hole CN may be filled with a material of the second conductive layer SP2. For example, the contact hole CN may also be formed in each of the organic insulating film IL-F1 and the additional insulating film IL-F2. Although FIG. 4 illustrates that a single contact hole CN is formed between the organic insulating film IL-F1 and the additional insulating film IL-F2, embodiments are not limited thereto, and contact holes CN may be formed in each of the organic insulating film IL-F1, the additional insulating film IL-F2, and the region between the organic insulating film IL-F1 and the additional insulating film IL-F2.

The upper insulating layer IL-U may be disposed on the organic insulating film IL-F1 and the additional insulating film IL-F2. The upper insulating layer IL-U may cover the second conductive layer SP2 and may be disposed on the organic insulating film IL-F1 and the additional insulating film IL-F2. The upper insulating layer IL-U may cover the organic insulating film IL-F1, the additional insulating film IL-F2, and the second conductive layer SP2. The upper insulating layer IL-U may include an organic insulating material. The organic insulating material may include at least any one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin. However, this is an example, and the organic insulating material is not limited to the above examples.

Figure 5:
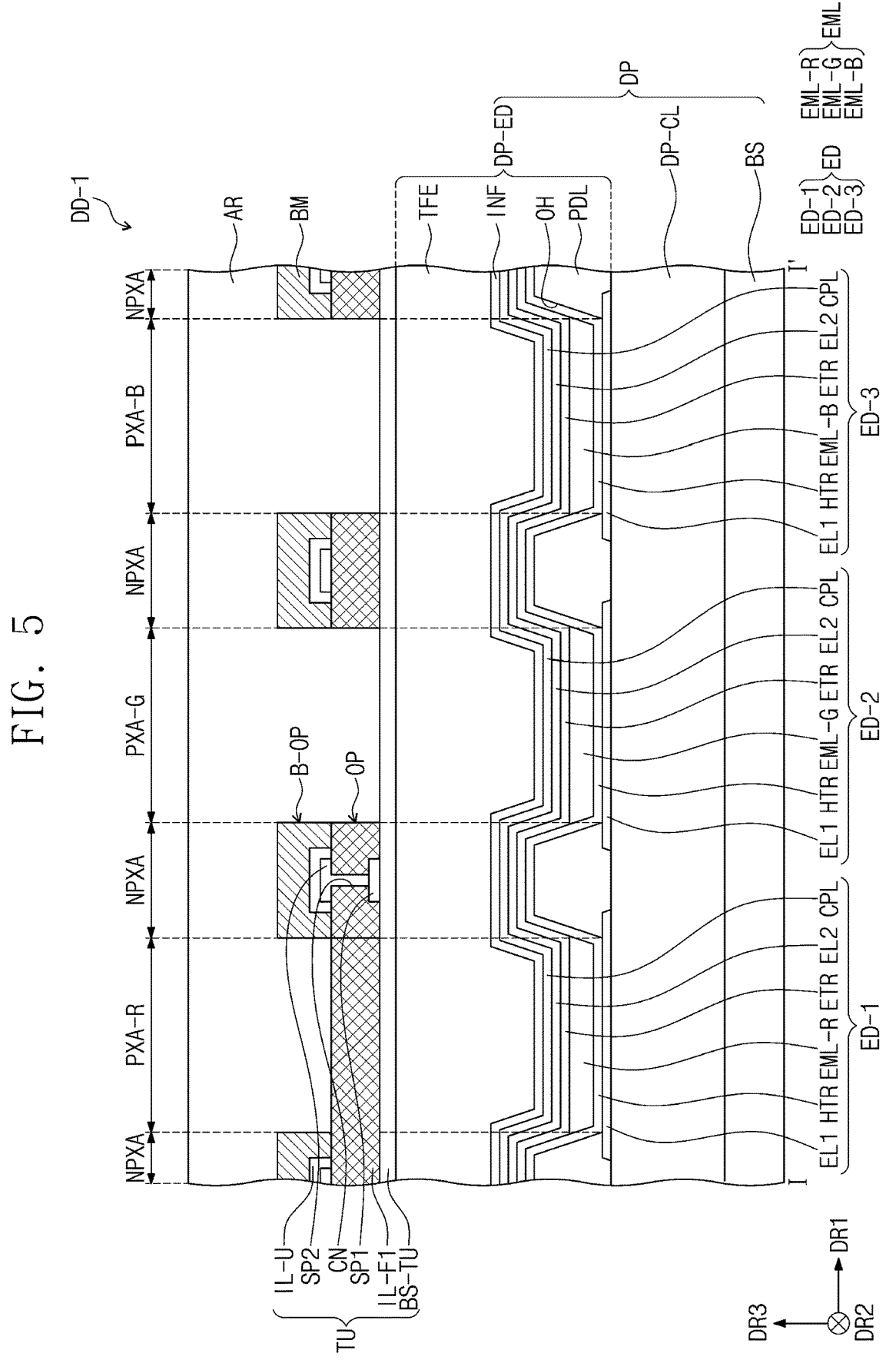
FIG. 5 is a schematic cross-sectional view of a display device according to an embodiment.

FIG. 5 is a schematic cross-sectional view of a display device according to an embodiment. FIG. 5 is a schematic cross-sectional view of a portion corresponding to the line I-I' of FIG. 3 in the display device according to an embodiment. Hereinafter, in describing the display device DD-1 according to an embodiment with reference to FIG. 5, the same reference numerals are assigned to the same components described above in FIGS. 3 and 4, and the detailed descriptions thereof will be omitted for descriptive convenience.

Referring to FIG. 5, in the display device DD-1 according to an embodiment, an additional insulating film IL-F2 may be omitted as compared to the display device DD illustrated in FIG. 4. As compared to the organic insulating film IL-F1 of the display device DD illustrated in FIG. 4, an organic insulating film IL-F1 of the display device DD-1 illustrated in FIG. 5 may overlap (e.g., entirely overlap) a light blocking region NPXA.

As illustrated in FIG. 5, the organic insulating film IL-F1 may overlap a first light-emitting region PXA-R and the light blocking region NPXA. The organic insulating film IL-F1 may overlap a first light-emitting element ED-1 and a light blocking member BM. The organic insulating film IL-F1 may overlap (e.g., entirely overlap) the light blocking member BM in a plan view. An opening OP overlapping a second light-emitting region PXA-G and a third light-emitting region PXA-B may be formed in the organic insulating film IL-F1. At least a portion of a light control layer AR may be disposed in the opening OP formed in the organic insulating film IL-F1.

A second conductive layer SP2 may be disposed on the organic insulating film IL-F1. An upper insulating layer IL-U may be disposed on the second conductive layer SP2. The upper insulating layer IL-U may cover the second conductive layer SP2 and may be disposed on the organic insulating film IL-F1. The upper insulating layer IL-U may overlap the light blocking region NPXA and may not overlap the light-emitting regions PXA-R, PXA-G, and PXA-B.

The light blocking member BM may be disposed on the upper insulating layer IL-U. The light blocking member BM may overlap the light blocking region NPXA. The light blocking member BM may cover the upper insulating layer IL-U. The light blocking member BM may seal (or encapsulate) the upper insulating layer IL-U. For example, the light blocking member BM may cover (e.g., entirely cover) an upper surface and lateral sides of the upper insulating layer IL-U. A light blocking opening B-OP corresponding to the light-emitting regions PXA-R, PXA-G, and PXA-B may be formed in the light blocking member BM.

A portion of the light control layer AR may be disposed in the opening OP and the light blocking opening B-OP. A portion of the light control layer AR may be disposed in the opening OP formed in the organic insulating film IL-F1 and in the light blocking opening B-OP formed in the light blocking member BM. The light control layer AR may fill the opening OP and the light blocking opening B-OP and may be disposed on the light blocking member BM. In an embodiment, the organic insulating film IL-F1 and the light control layer AR may be in contact with a sensor base layer BS-TU. As the additional insulating film IL-F2 illustrated in FIG. 4 is omitted in the display device DD-1 according to an embodiment, the light control layer AR may be in contact with the sensor base layer BS-TU.

A contact hole CN may be formed in the organic insulating film IL-F1. The first conductive layer SP1 and the second conductive layer SP2 may be electrically connected to each other through the contact hole CN. The contact hole CN may be filled with a material of the second conductive layer SP2. Although FIG. 4 illustrates that a single contact hole CN is formed in the organic insulating film IL-F1, embodiments are not limited thereto, and contact holes may be formed in the organic insulating film IL-F1.

For example, a portion of the upper insulating layer IL-U may be disposed in the opening OP formed in the organic insulating film IL-F1. For example, unlike what is illustrated in FIG. 4, in an embodiment, a portion of the upper insulating layer IL-U may be disposed in the opening OP formed in the organic insulating film IL-F1. For example, the upper insulating layer IL-U may overlap not only the light blocking region NPXA, but also the light-emitting regions PXA-R, PXA-G, and PXA-B. For example, the upper insulating layer IL-U may overlap (e.g., entirely overlap) the light-emitting regions PXA-R, PXA-G, and PXA-B and the light blocking region NPXA adjacent to the light-emitting regions PXA-R, PXA-G, and PXA-B.

Hereinafter, the display device DD including an organic insulating film IL-F1 according to an embodiment will be described in detail with reference to embodiments and a comparative example. The embodiments described below are examples for helping understanding of the invention, and the scope of the invention is not limited thereto.

First Embodiment 1

A display device DD of a first embodiment 1 may include the stacked structure illustrated in FIG. 4. An organic insulating film IL-F1 of the first embodiment 1 may include a second colorant and may have a thickness in a range of about 0.8 μm to about 1.0 μm.

Second Embodiment 2

A display device DD of a second embodiment 2 may be manufactured in the same manner as in the first embodiment 1 except that the organic insulating film IL-F1 has a thickness in a range of about 1.4 μm to about 1.5 μm.

Comparative Example 1

A display device may be manufactured in the same manner as in the first embodiment 1 except that a sensor layer does not include an organic insulating film IL-F1. In the comparative example 1, the organic insulating film IL-F1 of FIG. 4 is omitted, and an inorganic insulating film IL-F2 (e.g., additional insulating film IL-F2) may be formed as a single layer overlapping first, second, and third light-emitting regions PXA-R, PXA-G, and PXA-B.

FIGS. 6A, 6B, and 6C are graphs showing reflection spectra according to the display devices DD of the first embodiment 1 and the comparative example 1. FIG. 6A is a graph showing a reflection spectrum measured in the first light-emitting region PXA-R of each of the first embodiment 1 and the comparative example 1. FIG. 6B is a graph showing a reflection spectrum measured in the second light-emitting region PXA-G of each of the first embodiment 1 and the comparative example 1. FIG. 6C is a graph showing a reflection spectrum measured in the third light-emitting region PXA-B of each of the first embodiment 1 and the comparative example 1. Hereinafter, in case that the organic insulating film IL-F1 according to an embodiment is applied to the display devices DD, changes in reflection characteristics in the first, second, and third light-emitting regions PXA-R, PXA-G, and PXA-B will be described with reference to FIGS. 6A to 6C.

Referring to FIGS. 6B and 6C, in the case of the comparative example 1, the reflection peaks in the second light-emitting region PXA-G and the third light-emitting region PXA-B may not overlap each other. In the comparative example 1, the reflection spectrum of the second light-emitting region PXA-G has a reflection peak in the wavelength range of the second color light, and the reflection spectrum of the third light-emitting region PXA-B has a reflection peak in the wavelength range of the third color light. On the other hand, referring to FIG. 6A, the spectrum of the first light-emitting region PXA-R of the comparative example 1 has a reflection peak not only in the wavelength range of the first color light, but also in a short wavelength region lower than that of the first color light. In the comparative example 1, the spectrum of the first light-emitting region PXA-R has a first reflection peak in a wavelength range of about 625 nm to about 675 nm and a second reflection peak in a wavelength range of about 440 nm to about 460 nm. For example, in the display device DD of the comparative example 1, light in the short wavelength region other than the wavelength range of the first color light among external light incident on the first light-emitting region PXA-R may also be partially reflected. Thus, the color reproducibility of the display device DD may be reduced or degraded.

Referring to FIG. 6A, in the case of the first embodiment 1, the reflectance in the short wavelength region in the first light-emitting region PXA-R may be reduced, as compared to the comparative example 1. In the case of the comparative example 1, the comparative example 1 has a higher reflectance than the first embodiment 1 in a wavelength range of about 400 nm to about 580 nm. However, the first embodiment 1 may have a high reflectance in a wavelength range of about 625 nm to about 675 nm as compared to the comparative example 1, and the first embodiment 1 may have a low reflectance of about 5% or less in a wavelength range of about 400 nm to about 580 nm. Thus, the display device DD of the first embodiment 1 may have a low reflectance with respect to light in the short wavelength region, e.g., light in the wavelength range of the second color light and the third color light among external light incident on the first light-emitting region PXA-R. As the display device DD of the first embodiment 1 has a high reflectance in the wavelength range of the first color light as compared to the comparative example 1, red light may be more efficiently reflected and reproduced. Accordingly, the display device DD including the organic insulating film IL-F1 according to an embodiment may have high color reproducibility. As the display device DD according to an embodiment effectively blocks light of about 400 nm to about 580 nm by applying the organic insulating film IL-F1 including the second colorant that absorbs light of the short wavelength region, the display device DD may have a low reflectance and excellent color reproducibility.

Referring to FIGS. 6B and 6C, there is no significant difference in reflectance between the first embodiment 1 and the comparative example 1 measured in the second light-emitting region PXA-G and the third light-emitting region PXA-B. The reflectance of the first embodiment 1 may have a similar level (or degree) of reflectance as compared to the reflectance of the comparative example 1. As the organic insulating film IL-F1 does not overlap the second light-emitting region PXA-G and the third light-emitting region PXA-B in the display device DD of the first embodiment 1, there is little difference in reflectance between the first embodiment 1 and the comparative example 1. Thus, the display device DD according to an embodiment may selectively control the reflectance and transmittance of light in a specific wavelength range according to the light-emitting region. Accordingly, by applying the organic insulating film IL-F1 including a short-wavelength absorbing colorant according to an embodiment to the first light-emitting region PXA-R, the color reproducibility of the display device DD may be improved and the display device DD having improved reliability may be provided to a user.

Table 1 shows the SCI (specular component included) reflectance of each light-emitting region of the display devices DD according to the first embodiment 1 and the comparative example 1. The SCI reflectance of Table 1 may be measured and evaluated by using a spectro photo meter CM3700-A (Konica Minolta, Inc.).

TABLE 1

| | SCI reflectance (%) | | |
| --- | --- | --- | --- |
| Division | First light-emitting region (e.g., PXA-R) | Second light-emitting region (e.g., PXA-G) | Third light-emitting region (e.g., PXA-B) |
| First Embodiment 1 | 8 | 23 | 17 |
| Comparative Example 1 | 24 | 23 | 17 |

Referring to Table 1, the reflectance in the first light-emitting region PXA-R of the first embodiment 1 is about 8%, which is reduced by about 65% as compared to the reflectance of 24% in the first light-emitting region PXA-R of the comparative example 1. The reflectance of the display device DD including the organic insulating film IL-F1 of the embodiment may be significantly reduced in the first light-emitting region PXA-R as compared to the reflectance of the display panel of the comparative example 1. Although the reflectance in the second light-emitting region PXA-G and the third light-emitting region PXA-B of the display panel DP of the embodiment has a level similar to that of the comparative example, the reflectance in the first light-emitting region PXA-R may be selectively reduced. Through the result of Table 1, since the organic insulating film IL-F1 according to the embodiment selectively transmits the first color light among the light provided from therebelow and reduces the light reflected by external light, the display device DD may have a low reflectance and high color reproducibility in case that the organic insulating film IL-F1 is applied to the display panel DP.

Table 2 shows the SCI (specular component included) reflectances and efficiency rates of the first embodiment 1, the second embodiment 2, and the comparative example 1. The efficiency rate means a current efficiency rate and shows a relative value in case that the efficiency of the comparative example 1 is about 100%. For example, the efficiencies are compared by measuring current efficiencies (Cd/mA). The SCI reflectances are evaluated by using a spectro photo meter CM3700-A (Konica Minolta, Inc.).

TABLE 2

| Division | SCI reflectance (%) | Efficiency rate |
|---|---|---|
| First Embodiment 1 | 6.5 | 94 |
| Second Embodiment 2 | 6.7 | 97 |
| Comparative Example 1 | 7.2 | 100 |

Referring to Table 2, the reflectances of the first and second embodiments 1 and 2 may be about 6.7% and about 6.5%, respectively, which are lower than the reflectance of the comparative example 1 of about 7.2%. Accordingly, the display devices DD according to the first and second embodiments 1 and 2 may have less reflection of external light than the display device DD of the comparative example 1. The efficiencies of the first and second embodiments 1 and 2 may be maintained at a level similar to that of the comparative example 1. Thus, the display devices DD of the embodiments may have the effect of reducing the reflection of external light with maintaining the efficiency similar to that of the comparative example 1. Accordingly, the display devices DD according to embodiments may be excellent in reflection of external light and efficiency characteristics. Referring to the first and second embodiments 1 and 2, it is possible to adjust the reflectance and efficiency rate of the display device DD to a certain level by changing the content of the colorant included in the organic insulating film IL-F1 according to an embodiment and/or the thickness of the organic insulating film IL-F1.

FIG. 7A is a graph showing transmittance according to the wavelength of a light control layer AR according to an embodiment. The measurement of transmittance according to the wavelength in FIG. 7A may be performed on the light control layer AR (refer to FIG. 4) according to an embodiment. In FIG. 7A, a light control layer AR1 and a light control layer AR2 may have a difference in transmittance peak. Referring to FIG. 7A, the light control layer AR1 may have a first peak in a wavelength range of about 585 nm to about 600 nm and a second peak in a wavelength range of about 420 nm to about 440 nm. The light control layer AR2 may have only the first peak in a wavelength range of about 570 nm to about 590 nm and may have a higher transmittance than the light control layer AR1 in the short wavelength region.

FIGS. 7B and 7C are graphs respectively showing the reflectance spectra of embodiments 1 and 2 and a comparative example 1 before and after application of the light control layer according to an embodiment. FIG. 7B is a graph showing transmittance according to the wavelength of the first and second embodiments 1 and 2 and the comparative example 1 before application of the light control layer. FIG. 7C is a graph showing transmittance according to the wavelength of the first and second embodiments 1 and 2 and the comparative example 1 after application of the light control layer. In FIG. 7C, the light control layer AR2 described above in FIG. 7A is applied to the first embodiment 1 and the second embodiment 2, and the light control layer AR1 described above in FIG. 7A is applied to the comparative example 1. For example, a light control layer AR having a high transmittance in the short wavelength region is applied to the first embodiment 1 and the second embodiment 2, and a light control layer AR having a relatively low transmittance in the short wavelength region is applied to the comparative example 1.

Referring to FIG. 7B, the average of the SCI reflectances of the first and second embodiments 1 and 2 before application of the light control layer may be smaller than the average of the SCI reflectance of the comparative example 1. Thus, the display device DD including the organic insulating film IL-F1 according to an embodiment may have an excellent effect of reducing the reflection of external light. The display device DD according to an embodiment may have an excellent effect of reducing the reflection of external light as light of the short wavelength region is effectively blocked by applying the organic insulating film IL-F1 including the second colorant to the sensor layer.

Referring to FIG. 7C, the SCI reflectances of the first and second embodiments 1 and 2 after application of the light control layer may be similar in level to the SCI reflectance of the comparative example 1. The first and second embodiments 1 and 2 may have an SCI reflectance similar in level to that of the comparative example 1 even in case that the light control layer having a high transmittance in the short wavelength region is applied. Further, the light control layer AR1 may be applied in the first and second embodiments 1 and 2. Since the light control layer AR2 has a low transmittance in the short wavelength region, in case that the light control layer AR2 is applied to the first and second embodiments 1 and 2, the display device DD may have a low SCI reflectance as compared to the comparative example 1.

FIG. 8 is a graph showing the result of evaluating the touch sensor sensitivity of the display devices DD according to the first embodiment 1 and the comparative example 1. Referring to FIG. 8, the display device DD of the first embodiment 1 may have sensor sensitivity similar in level to that of the display device DD of the comparative example 1. The display device DD of the first embodiment 1 may have sensor sensitivity similar in level to that of the comparative example 1 as the sensor sensibility is not reduced even in case that the organic film including the second colorant is applied to the sensor layer.

Since the display device DD according to an embodiment includes a sensor layer including an organic insulating film IL-F1 overlapping a specific light-emitting region, light efficiency may be improved, and the reflection of external light may be reduced.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:

a display panel;

a sensor layer disposed on the display panel; and a light control layer disposed on the sensor layer and comprising a first colorant, wherein the display panel comprises:

a base substrate in which a first light-emitting region that emits a first color light and a second light-emitting region that emits a second color light having a light-emitting wavelength different from a light-emitting wavelength of the first color light are defined;

a light-emitting element disposed on the base substrate; and an encapsulation layer disposed on the light-emitting element, and the sensor layer comprises:

a sensor base layer disposed on the encapsulation layer;

a first conductive layer disposed on the sensor base layer;

an organic insulating film disposed on the first conductive layer and comprising a second colorant, the organic insulating film overlapping the first light-emitting region;

a second conductive layer disposed on the organic insulating film;

an upper insulating layer disposed on the second conductive layer; and an additional insulating film disposed on the first conductive layer and overlapping the second light-emitting region.

2. The display device of claim 1, wherein the first color light is red light, and the second color light is green light or blue light.

3. The display device of claim 1, wherein the organic insulating film transmits the first color light and absorbs the second color light.

4. The display device of claim 1, wherein, in a wavelength range of about 400 nm to about 520 nm, a light transmittance of the organic insulating film is about 30% or less.

5. The display device of claim 1, wherein the organic insulating film further comprises a scatterer.

6. The display device of claim 1, wherein the upper insulating layer overlaps the first light-emitting region and the second light-emitting region.

7. The display device of claim 1, further comprising:

a light blocking member disposed on the sensor layer and including a light blocking opening overlapping the first light-emitting region and the second light-emitting region.

8. The display device of claim 7, wherein the organic insulating film overlaps at least a portion of the light blocking member.

9. The display device of claim 1, wherein an opening overlapping the second light-emitting region is formed in the organic insulating film.

10. The display device of claim 9, wherein a portion of the light control layer is disposed in the opening of the organic insulating film.

11. The display device of claim 1, wherein the light-emitting element comprises:

a first electrode disposed on the base substrate and overlapping the first light-emitting region and the second light-emitting region;

a hole transport region disposed on the first electrode;

a first light-emitting layer disposed on the hole transport region and overlapping the first light-emitting region, the first light-emitting layer that emits the first color light;

a second light-emitting layer disposed on the hole transport region and overlapping the second light-emitting region, the second light-emitting layer that emits the second color light;

an electron transport region disposed on the first light-emitting layer and the second light-emitting layer;

a second electrode disposed on the electron transport region; and a capping layer disposed on the second electrode.

12. The display device of claim 1, wherein the display panel further comprises an inorganic deposition layer disposed between the light-emitting element and the encapsulation layer.

13. The display device of claim 1, wherein:

a third light-emitting region that emits a third color light having a light-emitting wavelength different from light-emitting wavelengths of the first color light and the second color light is defined on the base substrate, and the organic insulating film does not overlap the second light-emitting region and the third light-emitting region.

14. A display device comprising:

a display panel;

a sensor layer disposed on the display panel; and a light control layer disposed on the sensor layer and comprising a first colorant, wherein the display panel comprises:

a base substrate in which a first light-emitting region that emits a first color light, a second light-emitting region that emits a second color light different from the first color light, and a third light-emitting region that emits a third color light different from the first color light and the second color light are defined;

a light-emitting element disposed on the base substrate; and an encapsulation layer disposed on the light-emitting element, and the sensor layer comprises:

a sensor base layer disposed on the encapsulation layer;

a first conductive layer disposed on the sensor base layer;

an organic insulating film overlapping the first light-emitting region and comprising a second colorant;

an inorganic insulating film overlapping the second light-emitting region and the third light-emitting region;

a second conductive layer disposed on the organic insulating film and the inorganic insulating film; and an upper insulating layer disposed on the second conductive layer.

15. The display device of claim 14, wherein the organic insulating film and the inorganic insulating film are disposed on a same layer.

16. A display device comprising:

a base substrate in which a first light-emitting region that emits a first color light, a second light-emitting region that emits a second color light different from the first color light, and a light blocking region adjacent to the first light-emitting region and the second light-emitting region are defined;

a light-emitting element disposed on the base substrate and comprising a first light-emitting element overlapping the first light-emitting region and a second color light emitting element overlapping the second light-emitting region;

an encapsulation layer disposed on the light-emitting element;

a sensor base layer disposed on the encapsulation layer;

a first conductive layer disposed on the sensor base layer;

an organic insulating film disposed on the first conductive layer and including an opening overlapping the second light-emitting region;

a second conductive layer disposed on the organic insulating film;

an upper insulating layer disposed on the second conductive layer;

a light blocking member disposed on the upper insulating layer, including a light blocking opening overlapping the first light-emitting region and the second light-emitting region, and overlapping the light blocking region; and a light control layer filling the opening of the organic insulating film and the light blocking opening of the light blocking member, disposed on the light blocking member, and comprising a first colorant.

17. The display device of claim 16, wherein the first color light is red light, and the second color light is green light or blue light.

18. The display device of claim 16, wherein each of the organic insulating film and the light control layer are in contact with an upper surface of the sensor base layer.

19. The display device of claim 16, wherein the organic insulating film overlaps the first light-emitting region and the light blocking region and does not overlap the second light-emitting region.

20. An electronic device comprising:

a display device comprising:

a display panel;

a sensor layer disposed on the display panel; and a light control layer disposed on the sensor layer and comprising a first colorant, wherein the display panel comprises:

a base substrate in which a first light-emitting region that emits a first color light and a second light-emitting region that emits a second color light having a light-emitting wavelength different from a light-emitting wavelength of the first color light are defined;

a light-emitting element disposed on the base substrate; and an encapsulation layer disposed on the light-emitting element, and the sensor layer comprises:

a sensor base layer disposed on the encapsulation layer;

a first conductive layer disposed on the sensor base layer;

an organic insulating film disposed on the first conductive layer and comprising a second colorant, the organic insulating film overlapping the first light-emitting region;

a second conductive layer disposed on the organic insulating film;

an upper insulating layer disposed on the second conductive layer; and an additional insulating film disposed on the first conductive layer and overlapping the second light-emitting region.

* * * * *